United States Patent
Im et al.

(10) Patent No.: US 12,487,285 B2
(45) Date of Patent: Dec. 2, 2025

(54) SCAN FLIP-FLOP, SCAN CHAIN CIRCUIT INCLUDING THE SAME, AND CONTROL METHOD OF THE SCAN FLIP-FLOP

(71) Applicant: SAMSUNG ELECTRONICS CO., LTD., Suwon-si (KR)

(72) Inventors: Changyoun Im, Suwon-si (KR); Yoonmyung Lee, Suwon-si (KR)

(73) Assignees: SAMSUNG ELECTRONICS CO., LTD., Suwon-si (KR); Research & Business Foundation Sungkyunkwan University, Suwon-si (KR)

( * ) Notice: Subject to any disclaimer, the term of this patent is extended or adjusted under 35 U.S.C. 154(b) by 78 days.

(21) Appl. No.: 18/499,314

(22) Filed: Nov. 1, 2023

(65) Prior Publication Data
US 2024/0142521 A1 May 2, 2024

(30) Foreign Application Priority Data

Nov. 1, 2022 (KR) .................. 10-2022-0143957
Mar. 13, 2023 (KR) .................. 10-2023-0032717

(51) Int. Cl.
*G01R 31/3185* (2006.01)
*G01R 31/317* (2006.01)

(52) U.S. Cl.
CPC ........... *G01R 31/318588* (2013.01); *G01R 31/31721* (2013.01); *G01R 31/318541* (2013.01)

(58) Field of Classification Search
CPC ...... G01R 31/318588; G01R 31/31721; G01R 31/318541

(Continued)

(56) References Cited

U.S. PATENT DOCUMENTS 8,004,908 B2 * 8/2011 Asano .............. H03K 3/356156
365/189.05
8,151,152 B2 * 4/2012 Kanari .................. H03K 3/037
327/216

(Continued)

FOREIGN PATENT DOCUMENTS

| JP | 2017063096 | 3/2017 |
| KR | 10-2192845 | 12/2020 |
| KR | 10-2212513 | 2/2021 |

OTHER PUBLICATIONS

Lee, et al., "A 20F2 Area-Efficient Differential NAN••-Structured Physically Unclonable Function for Low-Cost IoT Security", in IEEE Solid-State Circuits Letters, Sep. 1, 2019, DOI:10.1109/LSSC.2019.2935566, 5 pages.

(Continued)

*Primary Examiner* — James C Kerveros
(74) *Attorney, Agent, or Firm* — Morgan, Lewis & Bockius LLP

(57) ABSTRACT

A scan flip-flop configured to generate physically unclonable function (PUF) data according to the present disclosure includes a multiplexer configured to provide an internal signal through an input switch, a first latch circuit configured to latch the internal signal, wherein the first latch circuit comprises a first inverter, a second inverter, a first switch connected in parallel with the first inverter, and a second switch connected in series with the second inverter. Additionally, a second latch circuit configured to latch an output of the first latch circuit and output a latched value, wherein the second latch circuit comprises a third inverter, a fourth inverter, an output inverter connected in series with the third inverter, and a fourth switch connected in series with the fourth inverter. A third switch is configured to switch between the first latch circuit and the second latch circuit.

18 Claims, 22 Drawing Sheets

(58) Field of Classification Search
USPC .......................................................... 714/726
See application file for complete search history.

(56) References Cited

U.S. PATENT DOCUMENTS

| | | | | |
|---|---|---|---|---|
| 9,641,159 | B1* | 5/2017 | Liao | H03K 3/0372 |
| 9,948,464 | B1 | 4/2018 | Wang et al. | |
| 9,972,586 | B2 | 5/2018 | Okagaki | |
| 11,082,242 | B2 | 8/2021 | Lu | |
| 11,411,749 | B2 | 8/2022 | Schat | |
| 11,646,899 | B2 | 5/2023 | Lee et al. | |
| 2014/0298126 | A1* | 10/2014 | Sugiyama | G01R 31/318541 327/199 |
| 2019/0057179 | A1* | 2/2019 | Lee | G06F 30/394 |
| 2019/0074984 | A1 | 3/2019 | Shor et al. | |
| 2021/0391850 | A1* | 12/2021 | Wang | G01R 31/3187 |

OTHER PUBLICATIONS

Kim, et al., "Logic-embedded Physically Unclonable Functions for Synthesizable and Periphery-free Implementation for Low Area and Design Cost IoT Security", in IEEE 48th European Solid State Circuits Conference (ESSCIRC), 2022, DOI:10.1109/ESSCIRC55480. 2022.9911394, 4 pages.

Pang, et al., "25.2 A Reconfigurable RRAM Physically Unclonable Function Utilizing Post-Process Randomness Source With <6x10-6 Native Bit Error Rate", in IEEE International Solid-State Circuits Conference—(ISSCC), Feb. 17-21, 2019, DOi:10.1109/ISSCC.2019. 8662307, 4 pages.

Taneja, et al., "36.1 Unified In-Memory Dynamic TRNG and Multi-Bit Static PUF Entropy Generation for Ubiquitous Hardware Security", in IEEE International Solid-State Circuits Conference (ISSCC), Feb. 13-22, 2021, DOI:10.1109/ISSCC42613.2021. 9366019, 4 pages.

Shifman, et al., "An SRAM-Based PUF With a Capacitive Digital Preselection for a 1E-9 Key Error Probability", In IEEE Transactions on Circuits and Systems I: Regular Papers (vol. 67, Issue: 12, Dec. 2020), DOI: 10.1109/TCSI.2020.2996772, 15 pages.

He, et al., "36.5 An Automatic Self-Checking and Healing Physically Unclonable Function (PUF) with <3x10-8 Bit Error Rate", in IEEE International Solid-State Circuits Conference (ISSCC), Feb. 13-22, 2021, DOI:10.1109/ISSCC42613.2021.9365741, 4 pages.

\* cited by examiner

SCAN FLIP-FLOP, SCAN CHAIN CIRCUIT INCLUDING THE SAME, AND CONTROL METHOD OF THE SCAN FLIP-FLOP

CROSS-REFERENCE TO RELATED APPLICATION

This application is based on and claims priority under 35 U.S.C. § 119 to Korean Patent Application No. 10-2022-0143957, filed on Nov. 1, 2022 and 10-2023-0032717, filed on Mar. 13, 2023 in the Korean Intellectual Property Office, the disclosures of which are incorporated by reference herein in their entirety.

TECHNICAL FIELD

The present disclosure relates to a scan flip-flop, a scan chain circuit including the scan flip-flop, and a control method of the scan flip-flop. Particularly, the present disclosure relates to a scan flip-flop having a physically unclonable function (PUF), a device including the scan flip-flop, a scan chain circuit including the scan flip-flop, and a control method of the scan flip-flop.

BACKGROUND

Various methods have been used to achieve computer security. In some cases, computer security and digital security deals with the protection of computer systems and networks from damage or disruption of the services they provide. An example of a high security system is where a password is required to gain access to a computer system.

Another example of a security system is physically unclonable function (PUF). A PUF is based on a physical variation implemented in integrated circuits. The physical variations may be based on manufacturing processes and can be used to generate unique responses to an authentication function. In some cases, the responses generated by a PUF can be difficult to predict and a PUF-based circuit that uses a large number of response pairs can be made very secure.

As security requirements for semiconductor devices increase, semiconductor devices having a physically unclonable function (PUF) have been developed. Therefore, there is a need in the art for a more efficient and secure PUF circuit.

SUMMARY

The present disclosure provides a scan flip-flop capable of reducing design cost and design time for implementing a PUF function and improving the stability and security of a device using a structure of the scan flip flop with an embedded PUF function.

According to an aspect of the present disclosure, there is provided a scan flip-flop configured to generate PUF (Physically Unclonable Function) data, the scan flip-flop includes a multiplexer configured to provide an internal signal through an input switch, a first latch circuit configured to latch the internal signal, wherein the first latch circuit comprises a first inverter, a second inverter, a first switch connected in parallel with the first inverter, and a second switch connected in series with the second inverter, a second latch circuit configured to latch an output of the first latch circuit and output a latched value, wherein the second latch circuit comprises a third inverter, a fourth inverter, an output inverter connected in series with the third inverter, and a fourth switch connected in series with the fourth inverter, and a third switch configured to switch between the first latch circuit and the second latch circuit.

According to an aspect of the present disclosure, there is provided a method of a scan flip-flop including a multiplexer, a first latch circuit, and a second latch circuit including generating a switching threshold voltage of the first latch circuit, generating a first key value by amplifying a difference between the switching threshold voltage and a reference switching threshold voltage of the second latch circuit, and storing the first key value in the second latch circuit.

According to an aspect of the present disclosure, there is provided a scan chain circuit including a first scan flip-flop and a second scan flip-flop, wherein each of the first and second scan flip-flops includes an input circuit configured to provide an internal signal through an input inverter, a first latch circuit configured to generate a first switching threshold voltage for generating a key, wherein the first latch circuit comprises a first inverter, a second inverter, a first transmission gate connected in parallel with the first inverter, and a second transmission gate and a fifth transmission gates connected in series with the second inverter, a second latch circuit configured to generate the key by amplifying a difference between the first switching threshold voltage and the second switching threshold voltage, wherein the second latch circuit comprises a third inverter, a fourth inverter, an output inverter configured to output a latched value, and a fourth transmission gate connected in series with the fourth inverter, and a third transmission gate connected to an output terminal of the first latch circuit, wherein the third and fifth transmission gates operate complementarily with the input inverter and the fourth transmission gate.

BRIEF DESCRIPTION OF THE DRAWINGS

Embodiments will be more clearly understood from the following detailed description taken in conjunction with the accompanying drawings.

DETAILED DESCRIPTION OF THE EMBODIMENTS

Figure 1:
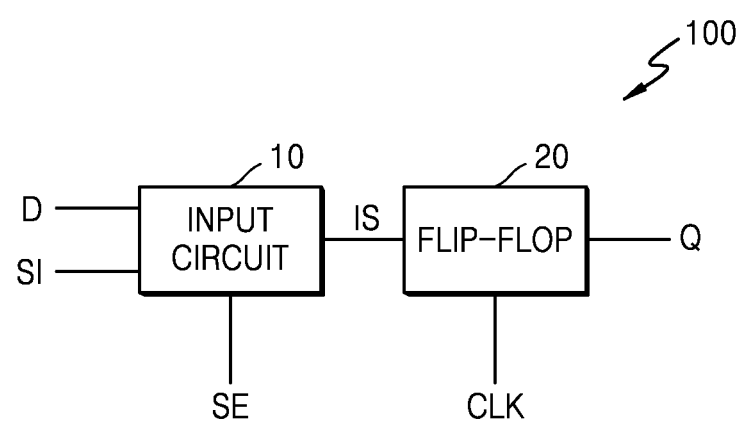
FIG. 1 is a schematic block diagram of a scan flip-flop according to an embodiment.

Embodiments of the present disclosure relate to a scan flip-flop, a scan chain circuit including the scan flip-flop, and a control method of using the scan flip-flop. Particularly, embodiments include a scan flip-flop having a physically unclonable function (PUF), a device including the scan flip-flop, a scan chain circuit including the scan flip-flop, and a control method of the scan flip-flop.

Conventionally, cryptography is used to make the transmitted data unreadable from unintended receivers. However, use of a non-volatile key for encryption and decryption of the confidential data in the cryptographic algorithms restricts the on-chip implementations. In a case when the key is stored off-chip, the circuit in a semiconductor device may be studied by decapsulating the chip to observe the stored key. As a result, such circuits may not provide security and privacy.

The security of a semiconductor device may be improved by generating a unique key using a physically unclonable function (PUF) circuit. The PUF circuit refers to a circuit that generates a digital value having random numbers implemented in a semiconductor chip by using a process deviation occurring in a semiconductor manufacturing process. In some cases, the PUF may be implemented using a reduced cell area. However, there are structural limitations in further reducing the unit cell area. Additionally, in a method of placing a separate module for PUF around a processor, a considerable area is allocated to a peripheral circuit that reads a key value.

Embodiments of the present disclosure include a scan flip-flop circuit configured to generate PUF data. According to some embodiments, the flip-flip circuit comprises a multiplexer configured to provide an internal signal through an input switch. Additionally, the circuit includes latch circuits (a first and a second latch circuit) including a plurality of inverters to latch an internal signal or to latch an output of a latch circuit. Herein, the first latch circuit and the second latch circuit include switches and inverters connected to each other.

Embodiments of the present disclosure include a scan flip-flop, a scan chain circuit including the same, and a control method thereof may include a PUF function by utilizing an existing scan flip-flop structure. Accordingly, by avoiding an additional area for implementing the PUF function, a design area may be reduced, and resource consumption such as a design cost and a design time may be reduced. Additionally, embodiments do not include a separate and independent PUF module which increases safety against external security attacks.

According to some embodiments, self-determination of stability and a stabilization technique based thereon can be implemented through reconfiguration of the internal circuit of the scan flip-flop without a separate module. Therefore, efficiency can be increased by recycling the scan flip-flop through reconfiguration of the circuit. Moreover, in some cases, embodiments may be used as a standard cell through a PUF cell library. Hence, PUF cells may be automatically placed in a design process, and thus, design time and cost may be reduced. Additionally, random placement of the PUF cells by an EDA tool increases the security.

Embodiments of the present disclosure include a scan flip-flop configured to generate PUF data, the scan flip-flop includes a multiplexer, a first latch circuit, and a second latch circuit. In some cases, the multiplexer is configured to provide an internal signal through an input switch. The first latch circuit is configured to latch the internal signal, wherein the first latch circuit comprises a first inverter, a second inverter, a first switch connected in parallel with the first inverter, and a second switch connected in series with the second inverter. Additionally, a second latch circuit is configured to latch an output of the first latch circuit and output a latched value, wherein the second latch circuit comprises a third inverter, a fourth inverter, an output inverter connected in series with the third inverter, and a fourth switch connected in series with the fourth inverter, and a third switch configured to switch between the first latch circuit and the second latch circuit.

The present disclosure may be modified in multiple alternate forms, and thus specific embodiments will be exemplified in the drawings and described in detail. In the present specification, when a component (or a region, a layer, a portion, etc.) is referred to as being "on," "connected to," or "coupled to" another component, it means that the component may be directly disposed on/connected to/coupled to the other component, or that a third component may be disposed therebetween.

Like reference numerals may refer to like components throughout the specification and the drawings. It is noted that while the drawings are intended to illustrate actual relative dimensions of a particular embodiment of the specification, the present disclosure is not necessarily limited to the embodiments shown. The term "and/or" includes all combinations of one or more of which associated configurations may define.

It will be understood that, although the terms "first," "second," etc. may be used herein to describe various components, these components should not necessarily be limited by these terms. These terms are only used to distinguish one component from another. For example, a first component could be termed a second component, and, similarly, a second component could be termed a first component, without departing from the scope of the inventive concept. The terms of a singular form may include plural forms unless the context clearly indicates otherwise.

Additionally, terms such as "below," "under," "on," and "above" may be used to describe the relationship between components illustrated in the figures. The terms are used as a relative concept and are described with reference to the direction indicated in the drawings. It should be understood that the terms "comprise," "include," or "have" are intended to specify the presence of stated features, integers, steps, operations, components, parts, or combinations thereof in the disclosure, but do not preclude the presence or addition of one or more other features, integers, steps, operations, components, parts, or combinations thereof.

Hereinafter, embodiments of the inventive concept are described in detail with reference to the accompanying drawings, wherein a scan flip-flop circuit, a scan chain circuit including the scan flip-flop circuit are described, and a control method thereof may include a PUF function by using an existing scan flip-flop structure.

Figure 2:
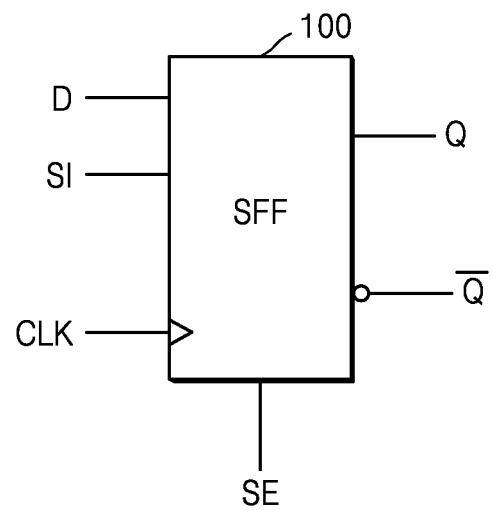
FIG. 2 is a diagram showing the scan flip-flop of FIG. 1 with logic symbols.

FIG. 1 is a schematic block diagram of a scan flip-flop (SFF) 100 according to an embodiment, and FIG. 2 is a diagram showing the scan flip-flop 100 of FIG. 1 with logic symbols.

Referring to FIGS. 1 and 2, a scan flip-flop (SFF) 100 may include an input circuit 10 and a flip-flop 20. The input circuit 10 may receive a data input signal D and a scan input signal SI, and may select one of the data input signal D and the scan input signal SI according to an operation mode. In some cases, the input circuit 10 may perform the selection according to a scan enable signal SE and may provide the selected signal to the flip-flop 20 as an internal signal IS. The flip-flop 20 may latch the internal signal IS based on a clock signal CLK and generate an output signal Q.

More specifically, the input circuit 10 may select a data input signal D in a first operating mode and provide an internal signal IS based on the data input signal D and may select the scan input signal SI in a second operating mode and may provide an internal signal IS based on the scan input signal SI. For example, the first operation mode may be a normal operation mode in which data transfer is performed and the second operation mode may be a scan test mode in which a test operation is performed.

In one embodiment, the operation mode may be determined according to a logic level of the scan enable signal SE. For example, the operation mode is a normal operation mode when the scan enable signal SE is at a first logic level (e.g., a logic low level) and is a scan test mode when the scan enable signal SE is at a second logic level (e.g., a logic high level), but the inventive concept is not limited thereto. For example, in the normal operating mode, the input circuit 10 may provide the data input signal D as an internal signal IS, and the flip-flop FF may perform a normal operation in which the data input signal D is latched. In the scan test mode, the input circuit 10 may provide the scan input signal SI as an internal signal IS, and the flip-flop FF may perform a scan operation in which the scan input signal SI is latched.

Figure 3:
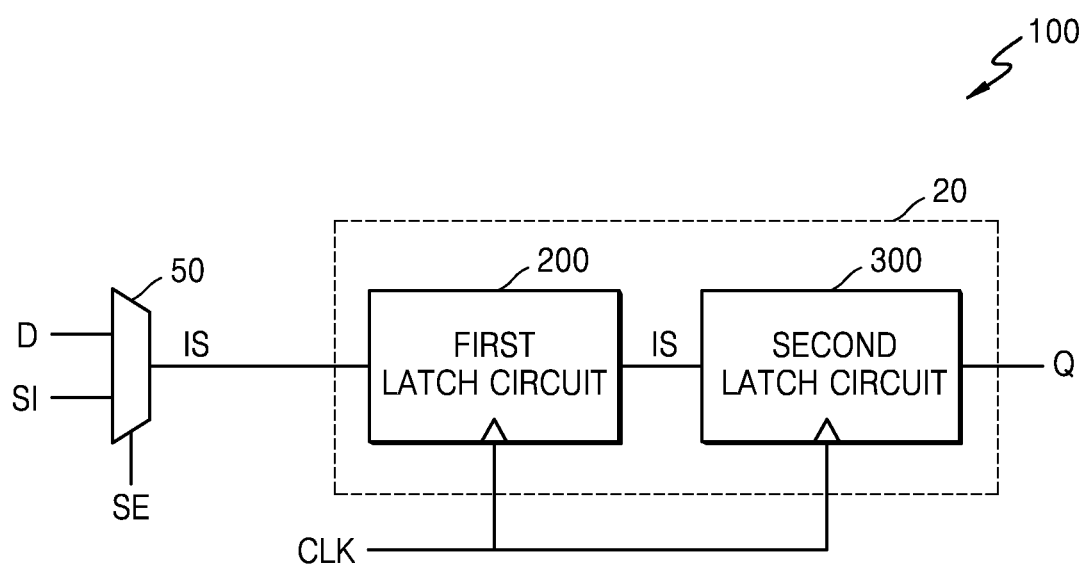
FIG. 3 is a block diagram showing a structure of a scan flip-flop according to an embodiment.

FIG. 3 is a block diagram showing a structure of a scan flip-flop 100 according to an embodiment.

Referring to FIG. 3, the scan flip-flop 100 may include a multiplexer 50, a first latch circuit 200, and a second latch circuit 300. The description of the scan flip-flop 100 provided with reference to FIGS. 1 and 2 may be applied to FIG. 3, and repeated descriptions are omitted.

The multiplexer 50 and the input switch IN_S may correspond to the input circuit 10 of FIG. 1. However, the present disclosure is not limited thereto, and the input circuit 10 of FIG. 1 may include other components in addition to the multiplexer 50 and the input switch IN_S. The multiplexer 50 may select one of the data input signal D and the scan input signal SI according to the scan enable signal SE, and output an internal signal IS through the input switch IN_S based on the selected signal. In one embodiment, the multiplexer 50 may be referred to as a MUX, a SCAN MUX, or a selector.

The first latch circuit 200 and the second latch circuit 300 may correspond to the flip-flop 20 of FIG. 1. However, the present disclosure is not limited thereto, and the flip-flop 20 of FIG. 1 may include other components in addition to the first latch circuit 200 and the second latch circuit 300. The first latch circuit 200 may latch the internal signal IS based on a clock signal CLK, and the second latch circuit 300 may provide an output signal Q by latching an output of the first latch circuit 200 based on the clock signal CLK.

According to an embodiment, the scan flip-flop 100 may generate data having a physically unclonable function (PUF) based on operations of the first latch circuit 200 and the second latch circuit 300. The PUF data may include a key value generated by the scan flip-flop 100, and the key value may be a random value due to differences in physical characteristics of transistors.

A PUF is an object that provides a defined output (response) for a given input and conditions (challenge). In some cases, the response serves as a unique identifier, most often for a semiconductor device such as a microprocessor. PUFs are based on unique physical variations occurring during semiconductor manufacturing. A PUF circuit refers to a circuit that generates a digital value having random numbers and that implemented inside a semiconductor chip by using a process deviation occurring in a semiconductor manufacturing process. A PUF-based semiconductor device may generate a unique key using a PUF circuit, and accordingly, device security may be improved.

Figure 4:
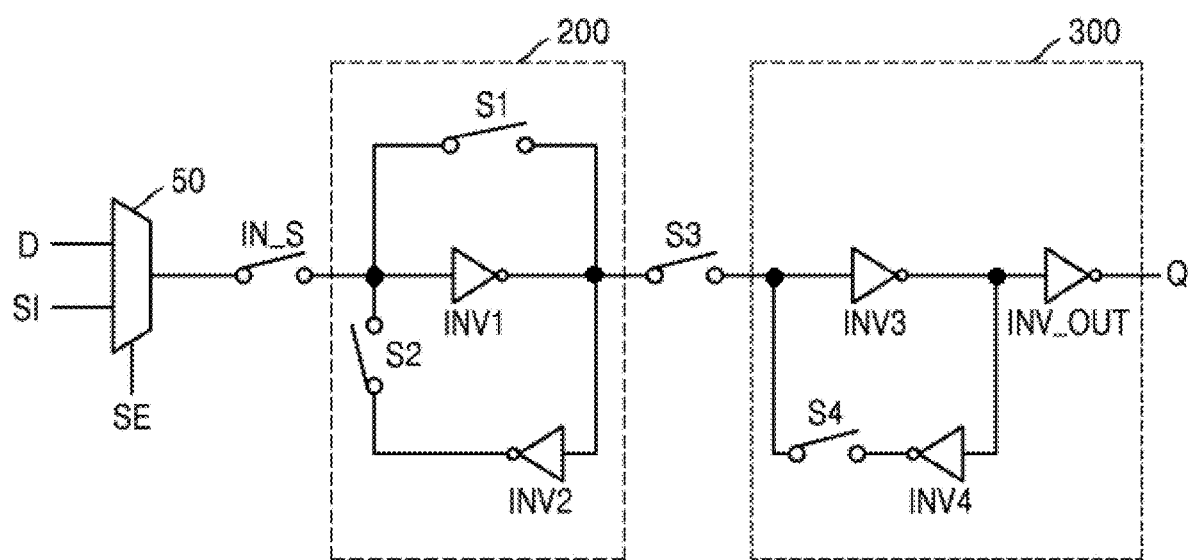
FIG. 4 is a circuit diagram illustrating a scan flip-flop according to an embodiment.

FIG. 4 is a circuit diagram specifically illustrating a scan flip-flop according to an embodiment.

Referring to FIGS. 3 and 4, the first latch circuit 200 may include a first inverter INV1, a second inverter INV2, a first switch S1, and a second switch S2. the second latch circuit 300 may include a third inverter INV3, a fourth inverter INV4, an output inverter INV_OUT, and a fourth switch S4. The first latch circuit 200 and the second latch circuit 300 may be connected to each other via a third switch S3.

In some embodiments, each of the first to fourth switches S1 to S4 may be implemented as transmission gates and perform a complementary operation between the transmission gates. The first latch circuit 200 may further include a transmission gate connected in series with the second inverter INV2. For example, the scan flip-flop 100 may be configured as described with reference to FIG. 21.

More specifically, the first inverter INV1 may be connected to the first switch SI in parallel and may generate a threshold voltage for generating a key (or a switching threshold voltage). The second inverter INV2 and the second switch S2 may be connected in series and the first latch circuit 200 may be reconfigured through a switching operation. The fourth inverter INV4 and the fourth switch S4 may be connected in series and connected in parallel with the third inverter INV3 to latch (or store) a generated key.

Figure 5:
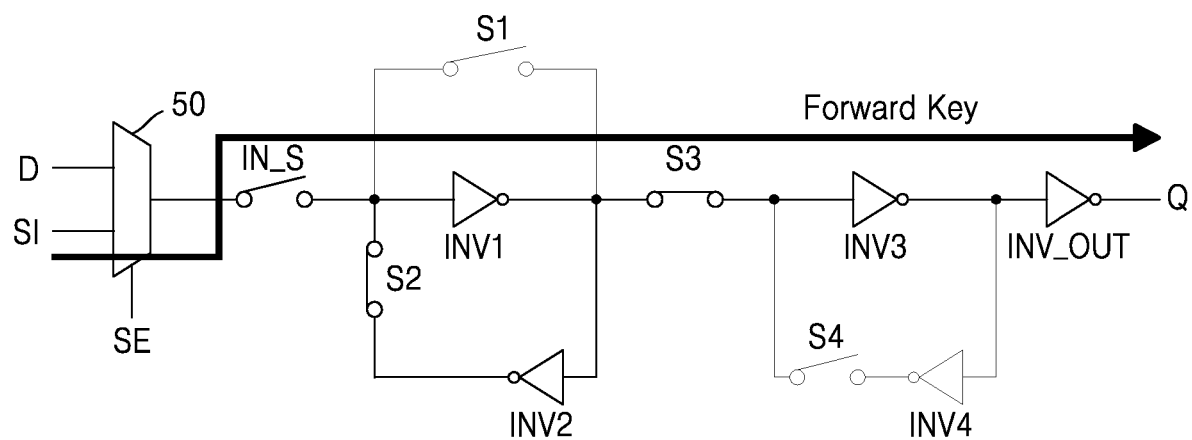
FIG. 5 is a circuit diagram for explaining a flip-flop operation of a scan flip-flop according to an embodiment

FIG. 5 is a circuit diagram for explaining a flip-flop operation of the scan flip-flop 100 according to an embodiment.

Referring to FIGS. 3 to 5, the scan flip-flop 100 may perform a flip-flop operation through a switching operation. Specifically, a flip-flop operation for transmitting a data signal is performed through a switching operation of switches included in the first latch circuit 200 and the second latch circuit 300 according to the clock signal CLK of FIG. 3. For example, as will be described later in detail, the scan flip-flop 100 may switch the input switch IN_S and the fourth switch S4, and the second switch S2 and the third switch S3 to transfer (or read out) the generated key.

That is, because the scan flip-flop 100 according to an embodiment may transfer a key to the next cell through an existing flip-flop operation, a separate read-out circuit is not required. Therefore, an area for outputting PUF data may be effectively reduced.

Figure 6:
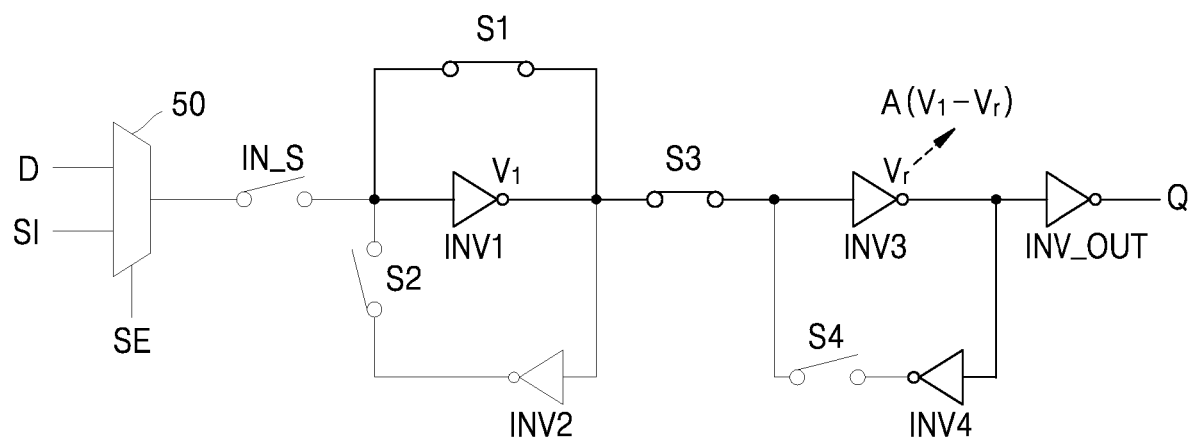
FIG. 6 is a circuit diagram illustrating a key generation operation of a scan flip-flop according to an embodiment.

FIG. 6 is a circuit diagram illustrating a key generation operation of a scan flip-flop according to an embodiment.

Referring to FIGS. 4 and 6, the scan flip-flop 100 may generate a key value through a switching operation. Specifically, in order to generate a key value, the scan flip-flop 100 may close the first switch S1 and the third switch S3 as shown (i.e., turn-on state), and may open the input switch (IN_S), the second switch S2, and the fourth switch S4 (i.e., turn-off state). Accordingly, input and output of the first inverter INV1 may be short-circuited and the first inverter INV1 may generate a first threshold voltage (or switching threshold voltage) $V_1$. The third inverter INV3 may receive the first threshold voltage $V_1$ generated by the first inverter INV1 and the third inverter INV3 may similarly have a reference threshold voltage (or a reference switching threshold voltage) $V_r$. The third inverter INV3 may amplify a difference between the first threshold voltage $V_1$ generated by the first latch circuit 200 and the reference threshold voltage $V_r$. For example, the third inverter INV3 may have an amplification value A and output $A(V_1-V_r)$ through the amplification. Also, the fourth inverter INV4 may receive and further amplify the output of the third inverter INV3 in the same manner. That is, the scan flip-flop 100 may amplify a difference between the first threshold voltage $V_1$ and the reference threshold voltage $V_r$ through inverters, and a first key value having a value of 0 or 1 may be generated.

As described above, because the switching threshold voltages of the transistor(s) included in the first inverter INV1 and the third inverter INV3 have randomness due to the difference in physical characteristics of the transistors, a key value having randomness may be generated. In some embodiments, in order to increase randomness by increasing process deviation, the first inverter INV1 and/or the third inverter INV3 may be designed with a minimum size provided by a process.

Figure 7:
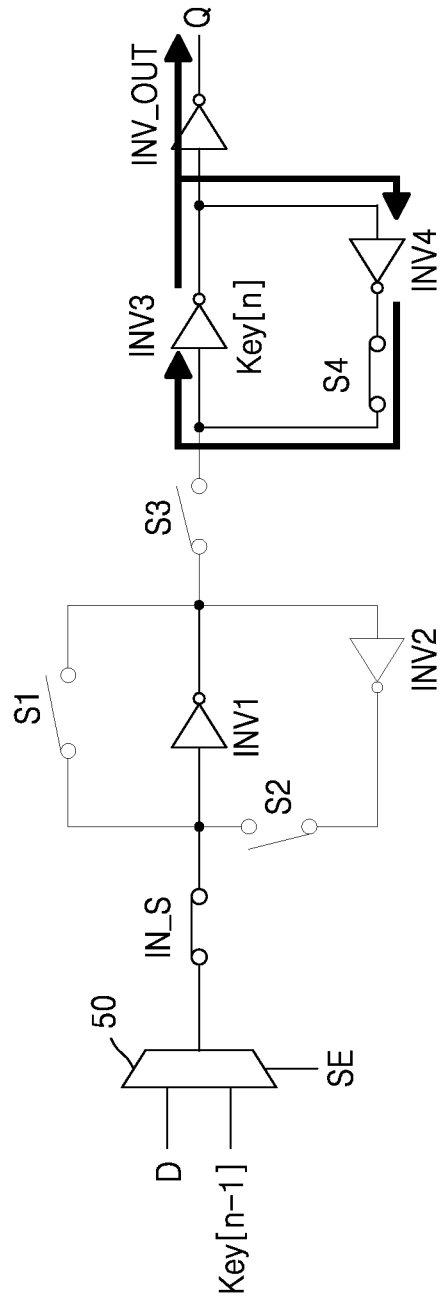
FIG. 7 is a circuit diagram illustrating a key storage operation of a scan flip-flop according to an embodiment.

FIG. 7 is a circuit diagram illustrating a key storage operation of a scan flip-flop according to an embodiment.

Referring to FIGS. 4 and 7, the scan flip-flop 100 may store (or latch) a key value (e.g., a first key value or Key[n]) generated through a switching operation. Specifically, the scan flip-flop 100 may turn off the first switch S1, the second switch S2, and the third switch S3 as shown in order to store the key value. Additionally, the scan flip-flop 100 may turn-off the input switch IN_S and the fourth switch S4. Therefore, the connection between the first latch circuit 200 and the second latch circuit 300 may be disconnected, and input/output terminals of the third inverter INV3 and the fourth inverter INV4 are connected to each other to latch a signal and thus, a value of the signal may be stably maintained. That is, the key value generated through the key generation operation may be stored in the second latch circuit 300.

The scan flip-flop 100 may provide an output signal Q to the next scan flip-flop (or next cell) through an output inverter INV_OUT. Similarly, the multiplexer 50 may receive a key value (e.g., Key[n-1]) generated in the previous scan flip-flop as an input signal. The key value (e.g., Key[n-1]) may be provided to the first inverter INV1 through the input switch IN_S. That is, each scan flip-flop may receive the key value generated by the previous scan flip-flop and may provide the generated key value as an output signal to the next scan flip-flop. Thereafter, as described above with reference to FIG. 5, a key value may be transmitted (or read out) using a flip-flop operation.

Accordingly, a separate lead-out circuit is not required to output the generated key value.

According to an embodiment, the scan flip-flop may generate a key constituting PUF data through an internal switching operation. In some cases, the present disclosure generates a key using a scan flip-flop without placing a separate PUF module for generating PUF data. By avoiding a separate PUF module, embodiments of the present disclosure can generate a key with a minimum area. Additionally, a peripheral circuit for PUF data (e.g., read-out circuit) is not required because a key value generated in a scan flip-flop may be read out through an internal switching operation (flip-flop operation) without a separate circuit for reading out the key value. Accordingly, embodiments may reduce not only an area of a module (or cell) for generating PUF data, but also an area of a peripheral circuit. Therefore, the present disclosure may effectively reduce the design cost and design time for generating PUF data and may further integrate the circuit through a reduction in required area.

Moreover, physical security attacks may be more effectively defended because an independent module for generating PUF data is not disposed (i.e., security information is generated in an existing circuit).

Figure 8:
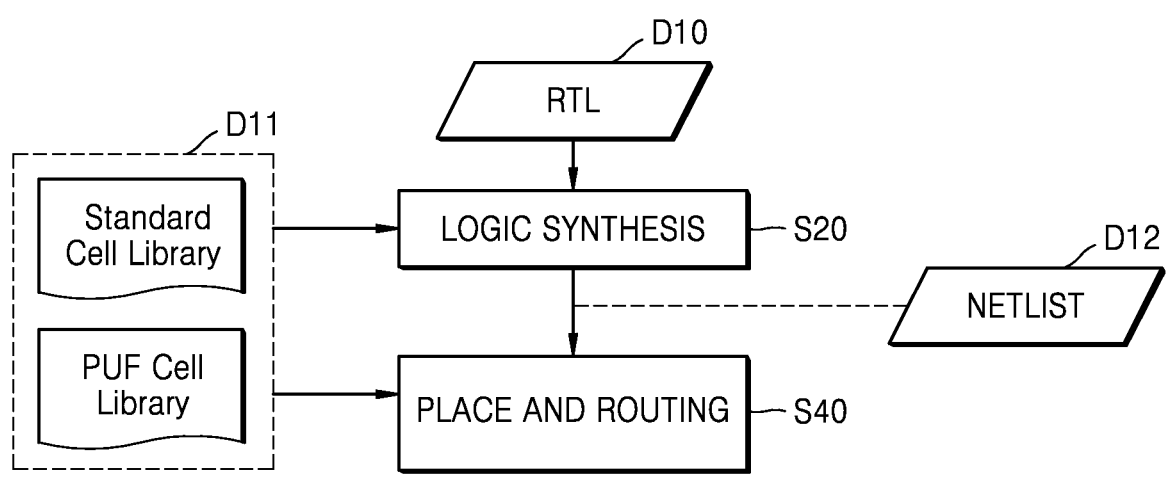
FIG. 8 is a flowchart illustrating a method of designing an integrated circuit including a scan flip-flop according to an embodiment.

FIG. 8 is a flowchart illustrating a method of designing an integrated circuit including a scan flip-flop according to an embodiment. Specifically, the flowchart of FIG. 8 shows an example of a method for designing (or manufacturing) an integrated circuit IC that includes a scanned flip-flop capable of generating PUF data.

Referring to FIG. 8, a method of designing an integrated circuit IC may include a logic synthesis operation S20 and a place and routing (PNR) operation S40.

A cell library D11 may include a standard cell library and a PUF cell library. The standard cell library may include information about cells, such as function information, characteristic information, and layout information. According to an embodiment, the PUF cell library may include information on PUF function implementation so that a scan flip-flop may be designed. That is, information that may be used in the logic synthesis operation S20 and the PNR operation S40 for designing a circuit through the standard cell library and the PUF cell library may be provided so that implementation of a scan flip-flop with a PUF function is automatically performed.

In the logic synthesis operation S20, a logic synthesis operation for generating a netlist D12 from an RTL data D10 may be performed. For example, a semiconductor design tool (e.g., a logic synthesis tool) may generate the netlist D12 including information on scan flip-flops having a PUF function by performing a logic synthesis with reference to the standard cell library and a PUF cell library D11 from the RTL data D10 written as a hardware description language (HDL) such as VHSIC hardware description language (VHDL) and a Verilog.

Register transfer level (RTL) is a process for defining the digital portions of a design. In some cases, the RTL design is captured using an HDL such as Verilog or VHDL. RTL is based on synchronous logic and includes three parts, i.e., registers which hold state information, combinatorial logic which defines the nest state inputs, and clocks that control when the state changes. In electronic design, a netlist refers to a description of the connectivity of an electronic circuit. For example, a netlist consists of a list of the electronic components in a circuit and a list of the nodes they are connected to.

In the PNR operation S40, placement and routing may be performed that generate layout data from the netlist D12. As a semiconductor design tool is executed, a plurality of standard cells including a scan flip-flop in which a PUF function is implemented may be placed by referring to the standard cell library and the PUF cell library D11 from the netlist D12. According to an example embodiment, the semiconductor design tool may randomly place scan flip-flops in which the PUF function is implemented. As the semiconductor design tool is executed, routing for generating interconnections that electrically connect output pins and input pins of the placed standard cells may be performed and layout data defining the placed cells and the generated interconnections may be generated. At this time, the output pins and input pins of the scan flip-flop in which the PUF function is implemented may be electrically connected to other standard cells.

The layout data generated as a result of performing the PNR operation S40 may be a basis for forming an integrated circuit IC and may include geometric information of the placed cells and interconnections. A process of forming a mask and manufacturing an integrated circuit IC may be performed based on the layout data.

In some cases, the flip-flop in which the PUF function is implemented is defined in the PUF cell library. Accordingly, the flip-flop in which the PUF function is implemented may be used as a standard cell. Additionally, as the scan flip-flop in which the PUF function is embedded is placed in an integrated circuit, an area and design cost of the integrated circuit may be reduced. Thus, by providing for the scan flip-flops to be placed automatically on the integrated circuits by the semiconductor design tool in a logic synthesis and/or PNR process, time and cost in the design stage may be effectively reduced.

Additionally, as the standard cells of the flip-flop in which the PUF function is implemented are randomly placed by the semiconductor design tool, it is difficult for an external attacker to directly check the structure and location of the PUF, and thus, resistance to physical attack may be increased.

Figure 9:
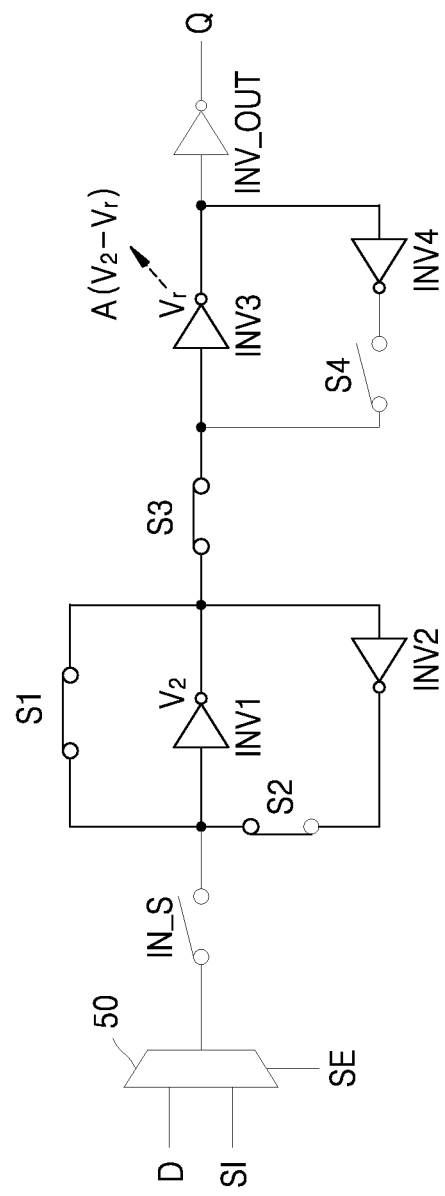
FIG. 9 is a circuit diagram illustrating a circuit reconfiguration operation of a scan flip-flop according to an embodiment.

FIG. 9 is a circuit diagram illustrating a circuit reconfiguration operation of a scan flip-flop according to an embodiment.

Referring to FIGS. 6 and 9, the scan flip-flop 100 may reconfigure the first latch circuit 200 to determine whether a generated key value is stable. For example, a processor (e.g., CPU, etc.) may determine whether a generated key value is stable or not. Specifically, the scan flip-flop 100 may reconfigure the first latch circuit 200 and then perform the key generation operation described above with reference to FIG. 6. As shown in FIG. 9, the scan flip-flop 100 may turn on the first switch S1, the second switch S2, and the third switch S3 and turn off the input switch IN_S and the fourth switch S4 to generate a key value by reconfiguring the circuit. Accordingly, inputs and outputs of the first and second inverters INV1 and INV2 may be short-circuited and the first inverter INV1 may generate a second threshold voltage (or switching threshold voltage) $V_2$. As described, the third inverter INV3 may have the reference threshold voltage (or reference switching threshold voltage) $V_r$ and the third inverter INV3 may amplify a difference between the voltage $V_2$ generated from the first latch circuit 200 and the reference threshold voltage $V_r$ and output $A(V_2-V_r)$. Similarly, the fourth inverter INV4 may receive and further amplify an output of the third inverter INV3. Thus, the scan flip-flop 100 may amplify a difference between the second threshold voltage $V_2$ and the reference threshold voltage $V_r$ through inverters and a second key value having a value of 0 or 1 may be generated. As described with reference to FIGS. 5 and 7, the second key value may be stored (i.e., latched) in the second latch circuit 300 and read out through a flip-flop operation.

In some embodiments, the first key value (i.e., generated as described with reference to FIG. 6) and the second key value (i.e., a key value generated in the circuit before reconfiguration and a key value generated in the reconfigured circuit) are compared. If a difference between the first threshold voltage $V_1$ and the reference threshold voltage $V_r$ is sufficiently large, a short circuit with the second inverter INV2 due to the reconfiguration of the circuit may affect the switching threshold voltage of the first inverter INV1, and thus, even if the first threshold voltage $V_1$ fluctuates to the second threshold voltage $V_2$, the first key value and the second key value may remain the same. If the key value fluctuates due to a short circuit with the second inverter INV2, that is, if the first key value and the second key value are different, a key value generated by the scan flip-flop 100 may be assumed to be unstable. For example, since a key value of the scan flip-flop 100 may fluctuate due to external noise or the like, it may be assumed to be unstable.

In some embodiments, if the first key value and the second key value are different, the corresponding scan flip-flop (or a cell including the corresponding scan flip-flop) may be masked because a corresponding scan flip-flop may destabilize PUF data.

According to an embodiment, the scan flip-flop may determine whether a key value is stable or not through a switching operation of an internal circuit. That is, the stability of a self-generated key value may be determined without an placement of additional circuits or modules. Accordingly, an area for implementing the PUF function may be reduced and resources consumed in design may be reduced.

Figure 10:
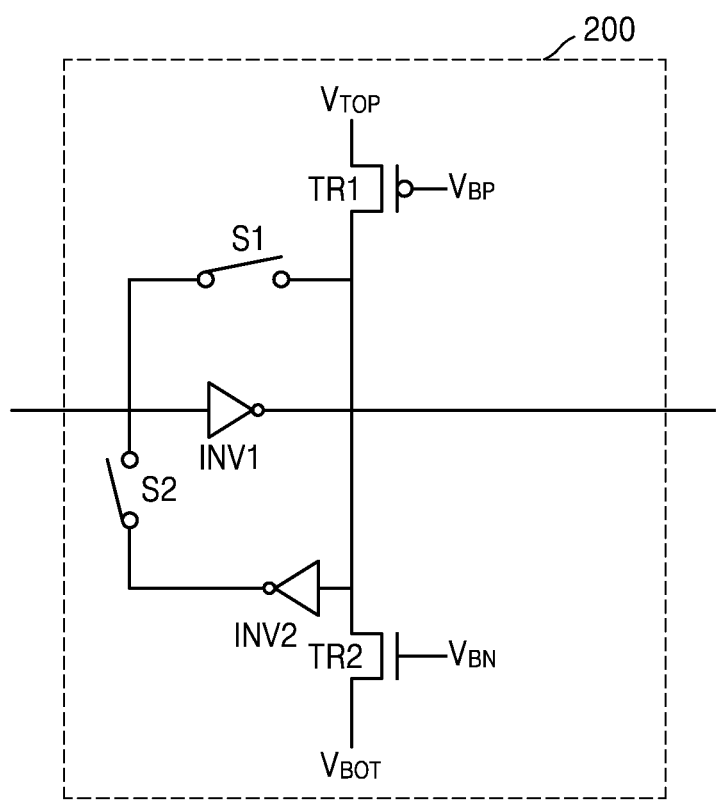
FIG. 10 is a circuit diagram illustrating a scan flip-flop according to an embodiment.

FIG. 10 is a circuit diagram specifically illustrating a scan flip-flop according to an embodiment.

Referring to FIGS. 4 and 10, the first latch circuit 200 of the scan flip-flop 100 may include a first transistor TR1 and a second transistor TR2. In some embodiments, the first transistor TR1 may be a P-channel metal oxide semiconductor (PMOS) transistor and the second transistor TR2 may be an N-channel metal oxide semiconductor (NMOS) transistor. However, the inventive concept is not limited thereto.

The first transistor TR1 is connected to a first voltage $V_{TOP}$ to provide a first applied current to an output terminal of the first inverter INV1 through the first gate voltage $V_{BP}$. The second transistor TR2 is connected to a second voltage $V_{BOT}$ to provide a second applied current to the output terminal of the first inverter INV1 through a second gate voltage $V_{BN}$. That is, a voltage received by the third inverter INV3 may be forcibly adjusted by applying a current to the first transistor TR1 and the second transistor TR2. Based on the application of the current, the stability of the scan flip-flop 100 may be determined as described with reference to FIGS. 11A to 12.

Figure 11A:
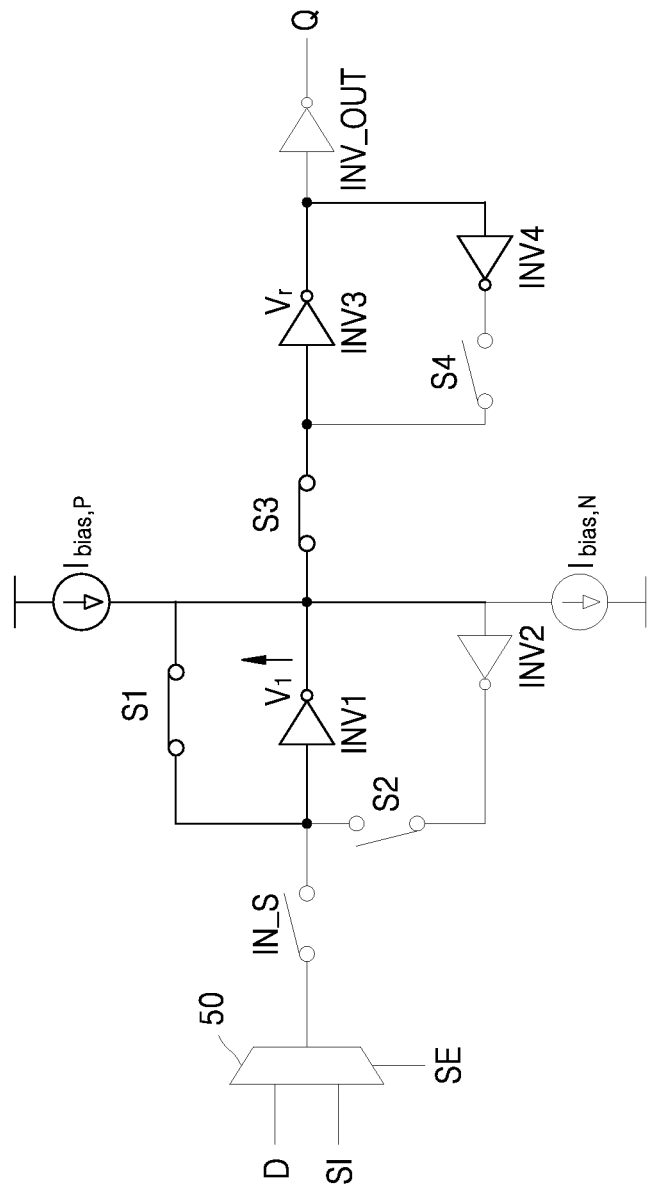
FIGS. 11A and 11B are circuit diagrams illustrating a stability determination operation of a scan flip-flop according to an embodiment.
Figure 11B:
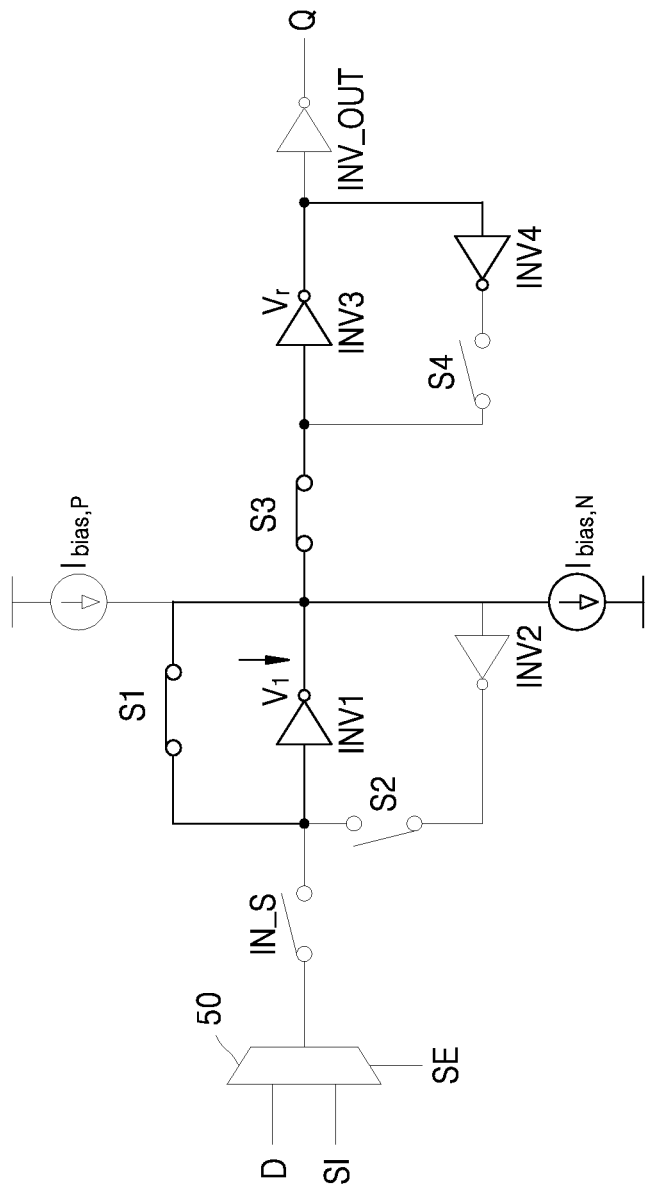
Figure 12:
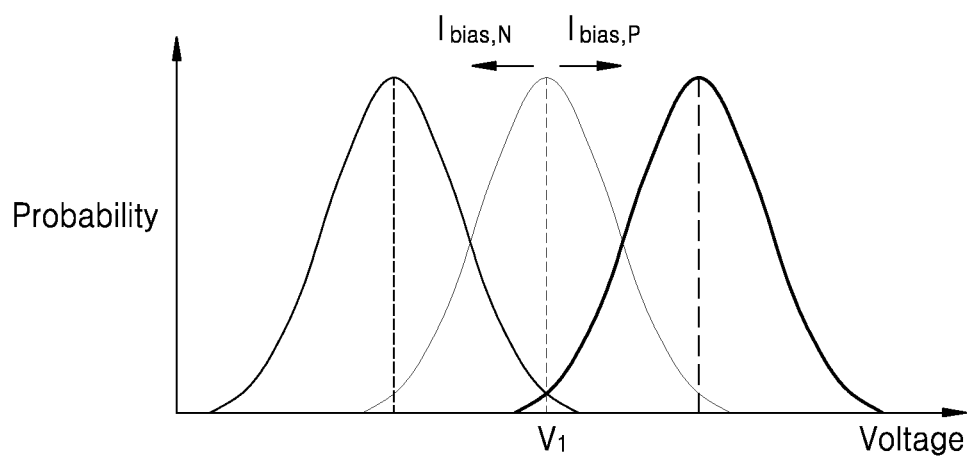
FIG. 12 is a graph for explaining the stability determination operation of FIGS. 11A and 11B.

FIGS. 11A and 11B are circuit diagrams illustrating a stability determination operation of a scan flip-flop according to an embodiment, and FIG. 12 is a graph for describing the stability determination operation of FIG. 11.

Referring to FIGS. 6, 10, 11A and 11B, the scan flip-flop 100 may each generate a key value to be compared based on the application of a current to the first transistor TR1 or the second transistor TR2, respectively, and the stability of the key value may be determined based on the generated key values. For example, a subject that determines the stability by comparing generated key values may be a processor (e.g., CPU, etc.). As described with reference to FIG. 6, the scan flip-flop 100 may generate a key value by turning on the first switch S1.

In some embodiments, when the first transistor TR1 is turned on and the second transistor TR2 is turned off, a first applied current $I_{bias,P}$ based on the first voltage $V_{TOP}$ and the first gate voltage $V_{BP}$ may be provided to the output terminal of the first inverter INV1. For example, the voltage of the output terminal of the first inverter INV1 may increase by providing the first applied current $I_{bias,P}$. That is, a first control voltage higher than the first threshold voltage $V_1$ may be provided to the third inverter INV3. The third inverter INV3 may receive the first control voltage and generate a third key value by amplifying a difference between the first control voltage and the reference threshold voltage $V_r$ of the third inverter INV3. Also, the fourth inverter INV4 may further amplify an output of the third inverter INV3. As described with reference to FIGS. 5 and 7, the third key value may be stored (i.e., latched) in the second latch circuit 300 and read out through a flip-flop operation.

In some embodiments, when the first transistor TR1 is turned off and the second transistor TR2 is turned on, a second applied current $I_{bias,N}$ based on the second voltage $V_{BOT}$ and the second gate voltage $V_{BN}$ may be provided to an output terminal of the first inverter INV1. For example, a voltage of the output terminal of the first inverter INV1 may be reduced by providing the second applied current $I_{bias,N}$. That is, a second adjusted voltage lower than the first threshold voltage $V_1$ may be provided to the third inverter INV3. The third inverter INV3 may receive the second adjusted voltage and generate a fourth key value by amplifying a difference between the second adjusted voltage and the reference threshold voltage $V_r$ of the third inverter INV3. Also, the fourth inverter INV4 may further amplify an output of the third inverter INV3. Similarly, as described with reference to FIGS. 5 and 7, the fourth key value may be stored (i.e., latched) in the second latch circuit 300 and read out through a flip-flop operation.

As shown in FIG. 12, the voltage at the output terminal of the first inverter INV1 may be greater than the first threshold voltage $V_1$ by providing the first applied current $I_{bias,P}$. That is, the distribution of the voltage received by the third inverter INV3 may move in a direction of increasing the voltage. Similarly, as the second applied current $I_{bias,N}$ is provided, the voltage at the output terminal of the first inverter INV1 may decrease and may be lower than the first threshold voltage $V_1$. That is, the distribution of the voltage received by the third inverter INV3 may move in the direction of decreasing the voltage. Based on the adjustment of the voltage received by the third inverter INV3, the processor may determine the stability of the scan flip-flop 100.

In some embodiments, the third key value and the fourth key value may be compared. If a key value generated by each of the first transistor TR1 and the second transistor TR2 by applying additional bias current does not change (i.e., if the third key value and the fourth key value are the same), it may be determined that the key value generated by the scan flip-flop 100 is relatively stable because the difference between the threshold voltage $V_1$ and the reference threshold voltage $V_r$ is relatively large. Conversely, if the third key value and the fourth key value are not equal due to the additional bias current, the difference between the first threshold voltage $V_1$ and the reference threshold voltage $V_r$ is relatively small, and thus, it may be determined that the key value generated by the scan flip-flop 100 may be relatively unstable. Thus, it may be determined that the stability of the key value generated by the scan flip-flop 100 is high as the value of an additional bias current by which the sameness of the third key value and the fourth key value may be maintained is large.

In some embodiments, the setting of a value of an additional bias current as a criterion for determining stability may be based on external control. The value of the additional bias current and the randomness of the key generated by the scan flip-flop 100 may have a trade-off relationship. In some cases, the value of the additional bias current is the criterion for determining stability. Accordingly, if the third key value and the fourth key value are the same (i.e., even if the value of the additional bias current is set high), the stability may be determined to be high. Although it is a scan flip-flop that may stably generate a constant key value even under an external influence (e.g., noise), it may be determined as an unstable scan flip-flop due to a high additional bias current. Therefore, the setting of the gate voltages $V_{BP}$ and $V_{BN}$ (for determining stability), needs to be set at an appropriate level and the setting of the voltages may be adjusted by external control to achieve an arbitrary goal.

In some embodiments, if the third key value and the fourth key value are different, the scan flip-flop (or a cell including the scan flip-flop) may be masked because a key value generated by a corresponding scan flip-flop may be determined to be relatively unstable.

According to an embodiment, the scan flip-flop may determine whether a key value is stable through an application of a bias current to an internal circuit. That is, the stability of the self-generated key value may be determined without the placement of additional circuits or modules. Therefore, an area and consumed resources for implementing and designing a PUF function may be effectively reduced. In addition, the stability against physical security attacks may be improved because an independent module is not required.

Figure 13:
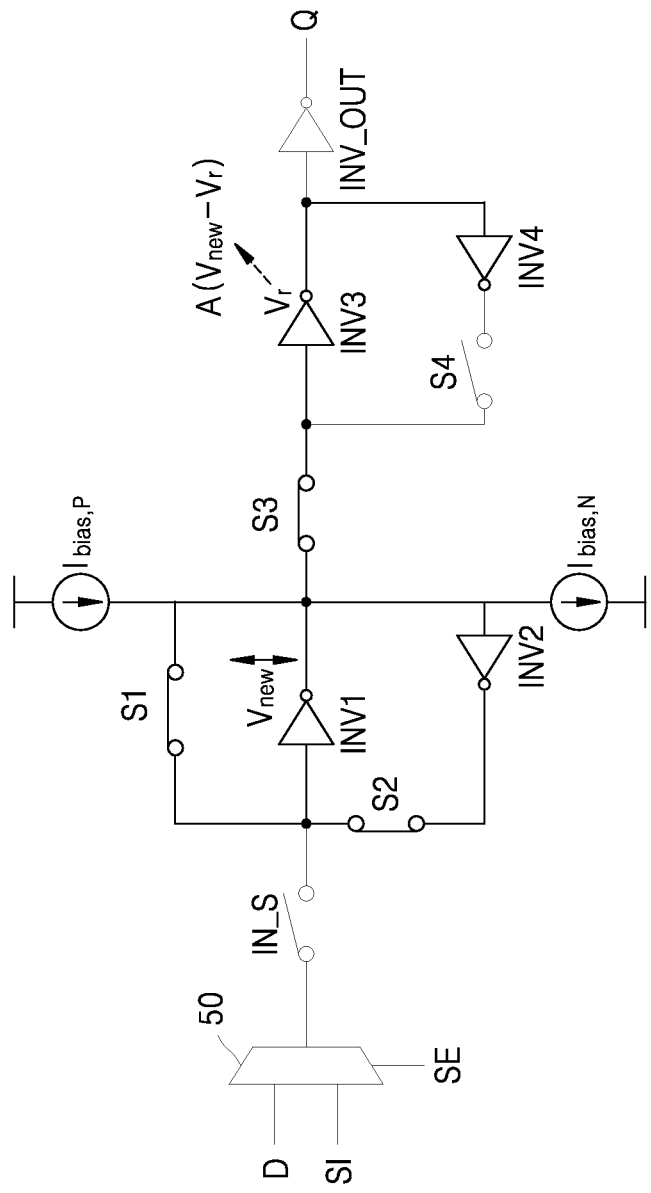
FIG. 13 is a circuit diagram illustrating a reconfiguration of a scan flip-flop and the stability determination operation according to the reconfiguration according to an embodiment.

FIG. 13 is a circuit diagram illustrating reconfiguration of a scan flip-flop and a stability determination operation based on a reconfiguration operation according to an embodiment.

Referring to FIGS. 9 to 13, the stability of an unstable scan flip-flop may be improved through circuit reconfiguration. As described with reference to FIG. 9, the scan flip-flop 100 may reconfigure the first latch circuit 200. By turning the second switch S2 on, inputs and outputs of the first and second inverters INV1 and INV2 may be short-circuited, and the first inverter INV1 may generate a new threshold voltage $V_{new}$ (or a new switching voltage). The third inverter INV3 may amplify a difference between the new threshold voltage $V_{new}$ generated by the first latch circuit 200 and the reference threshold voltage $V_r$ to output A ($V_{new}-V_r$), and based on this output a new key value may be generated. In some embodiments, a difference between switching threshold voltages of the first and third inverters INV1 and INV3 may relatively increase compared to the circuit before reconfiguration of the first latch circuit 200. That is, the stability of the scan flip-flop may be increased due to the circuit reconfiguration.

In some embodiments, the stability of the scan flip-flop 100 may be determined based on the reconfigured circuit. For example, a subject that determines the stability may be a processor (e.g., CPU, etc.). That is, as described with reference to FIGS. 10 to 13, key values generated by applying current to each of the first and second transistors TR1 and TR2 are compared which determines the stability of the reconfigured scan flip-flop 100.

Figure 14:
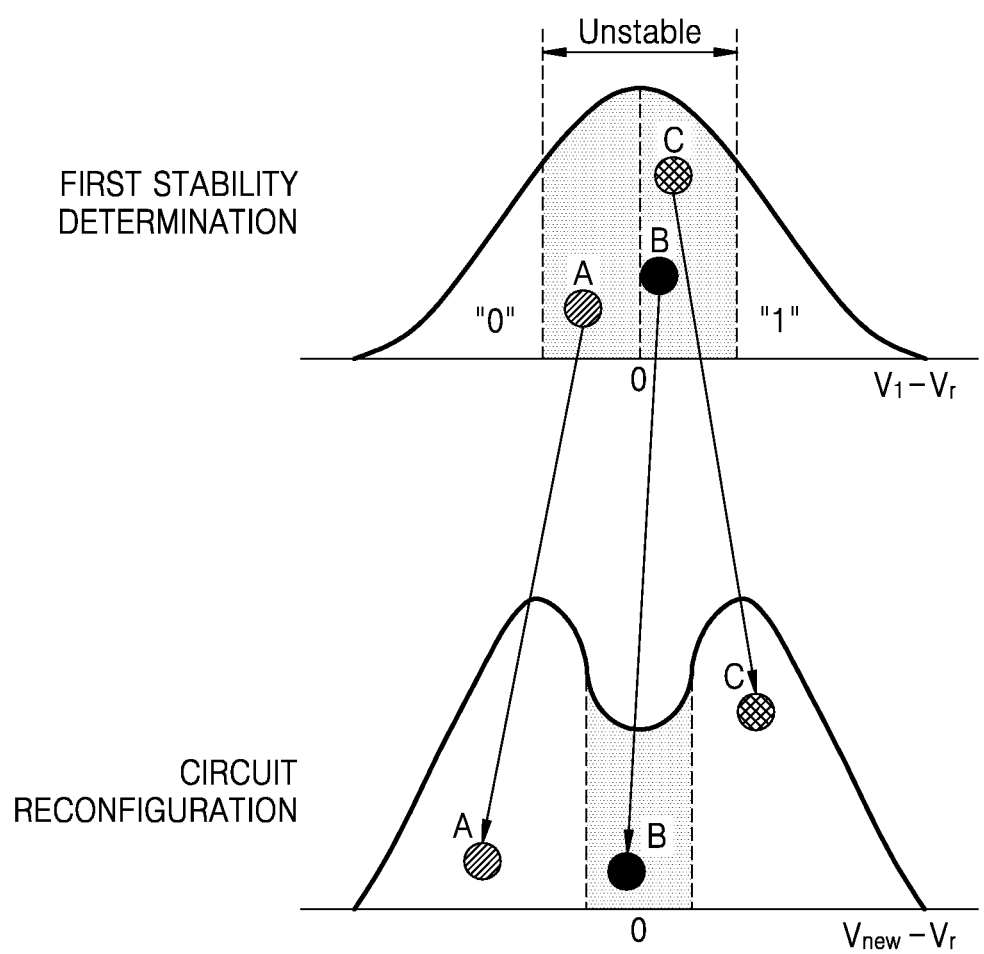
FIGS. 14 and 15 are graphs for explaining the operations of FIGS. 9, 11a, 11b, and 13.
Figure 15:
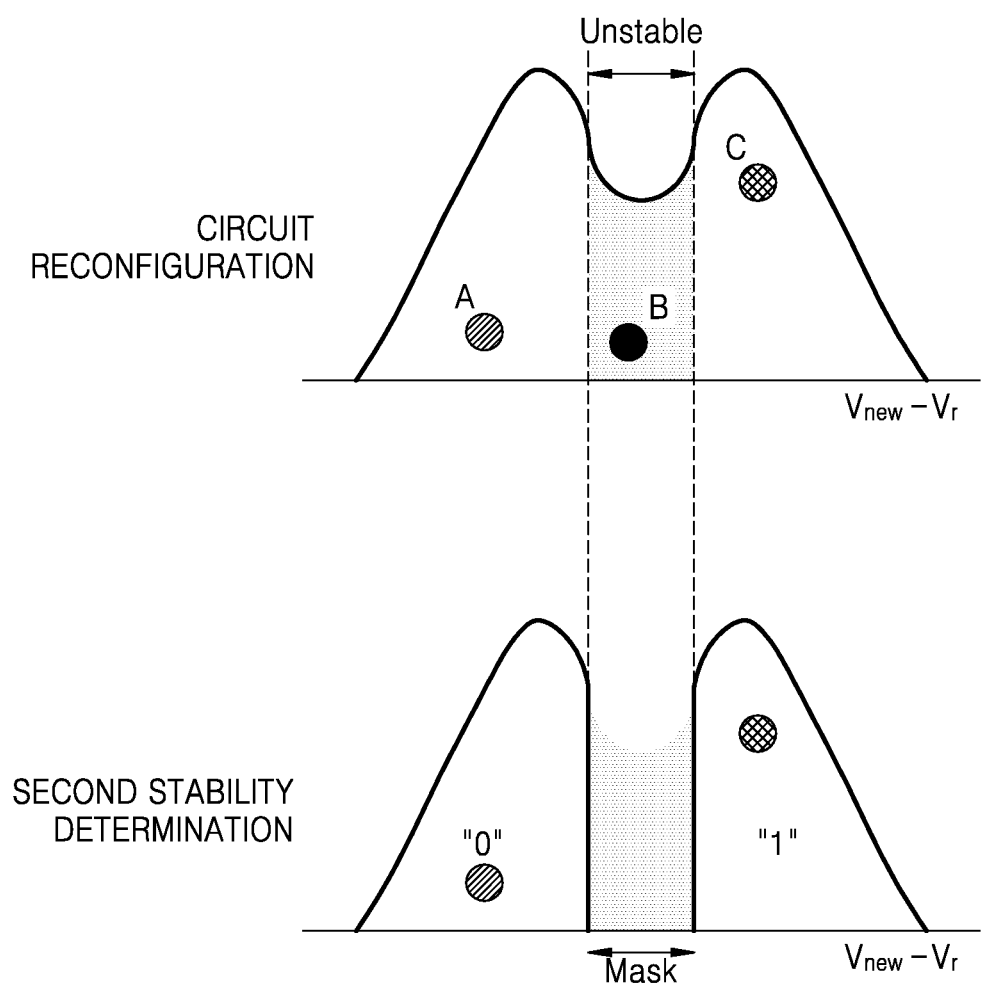

FIGS. 14 and 15 are graphs for explaining the operation of FIGS. 11A, 11B, and 13.

Referring to FIGS. 9 to 15, the stability determination (hereinafter, first stability determination) of scan flip-flops before reconfiguration and a stability determination (hereinafter, second stability determination) of reconfigured scan flip-flops may be performed. In some cases, the first stability determination may be performed as described with reference to FIGS. 11 and 12. Scan flip-flops in which generated key values are fluctuated (i.e., included in an unstable region) may be determined as unstable scan flip-flops by an arbitrary additional bias current. For example, first to third scan flip-flops A to C may be determined to be unstable.

In some embodiments, as described with reference to FIG. 13, a circuit of each of the first to third scan flip-flops A to C may be reconfigured. For example, a difference in switching threshold voltage between the first scan flip-flop A and the third scan flip-flop C may be relatively increased compared to a circuit before reconfiguration. That is, the distribution of the first scan flip-flop A and the third scan flip-flop C may be changed as illustrated due to the reconfiguration of the circuit. Alternatively, for example, the difference in switching threshold voltage of the second scan flip-flop B may not relatively significantly change despite the reconfiguration of the circuit. Thus, the change in stability of each of the scan flip-flops using the circuit reconfiguration may be different from each other due to the physical characteristics.

In some embodiments, the second stability determination is performed on the scan flip-flops (e.g., the first to third scan flip-flops A to C) in which the circuit is reconfigured according to the first stability determination. Whether key values generated based on the reconfigured circuit have changed or not may be determined by an arbitrary additional bias current. For example, as shown in FIG. 15, the first scan flip-flop A and the third scan flip-flop C may be determined to be stable because key values generated based on the additional bias current are maintained as a result of circuit reconfiguration. On the other hand, for example, in the case of the second scan flip-flop B, because key values generated based on the additional bias current fluctuate despite the circuit reconfiguration, the second scan flip-flop B is still included in an unstable region, and thus, may be determined to be unstable.

In some embodiments, because a key value generated by scan flip-flops included in an unstable region may be determined to be relatively unstable, the scan flip-flop (e.g., the second scan flip-flop B) may be masked.

As a result, it is possible to minimize masked cells by reusing unstable cells through circuit reconstruction for the scan flip-flops determined to be unstable by the first stability determination.

Additionally, the reliability of PUF data may further be increased by re-performing the stability determination (i.e., performing the second stability determination) for the scan flip-flops in which the circuit is reconfigured. That is, the present disclosure may reduce masked unstable scan flip-flops and simultaneously improve stability through a combination of a stability determination operation and a circuit reconfiguration operation.

Figure 16:
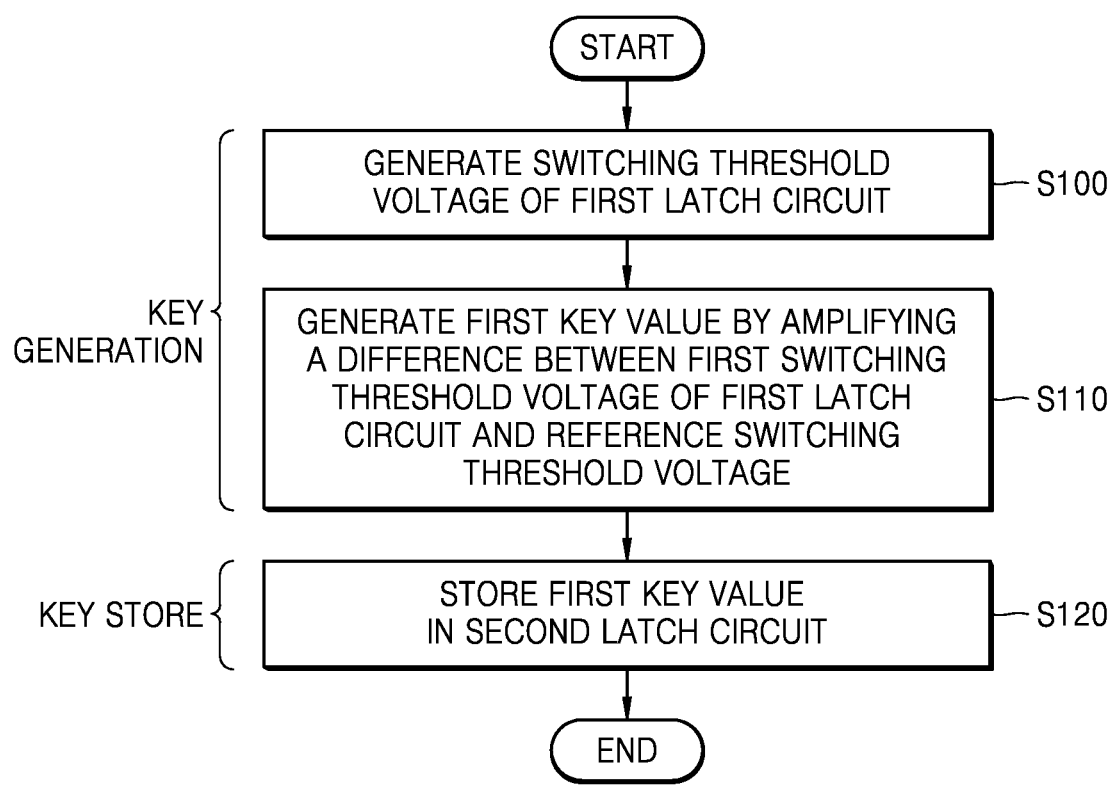
FIG. 16 is a flowchart illustrating a method of generating physically unclonable function (PUF) data according to an embodiment.

FIG. 16 is a flowchart illustrating a method of generating PUF data according to an embodiment.

Referring to FIGS. 5 to 7 and FIG. 16, a method of controlling a scan flip-flop according to an embodiment may generate a key using the scan flip-flop and store the generated key value. A process of generating a key may include generating a switching threshold voltage S100 and amplifying a difference between the switching threshold voltage and a reference switching threshold voltage S110. The scan flip-flop 100 may generate a first threshold voltage (or a switching threshold voltage) $V_1$ through the switching operation of the first latch circuit 200 described with reference to FIG. 6 (S100). The scan flip-flop 100 may generate a first key value by amplifying a difference between the first threshold voltage $V_1$ and the reference threshold voltage (or reference switching threshold voltage) $V_r$ of the second latch circuit 300 (S110). As described with reference to FIG. 7, the scan flip-flop 100 may latch (i.e., store) the first key value generated in the second latch circuit 300 through a switching operation.

Figure 17:
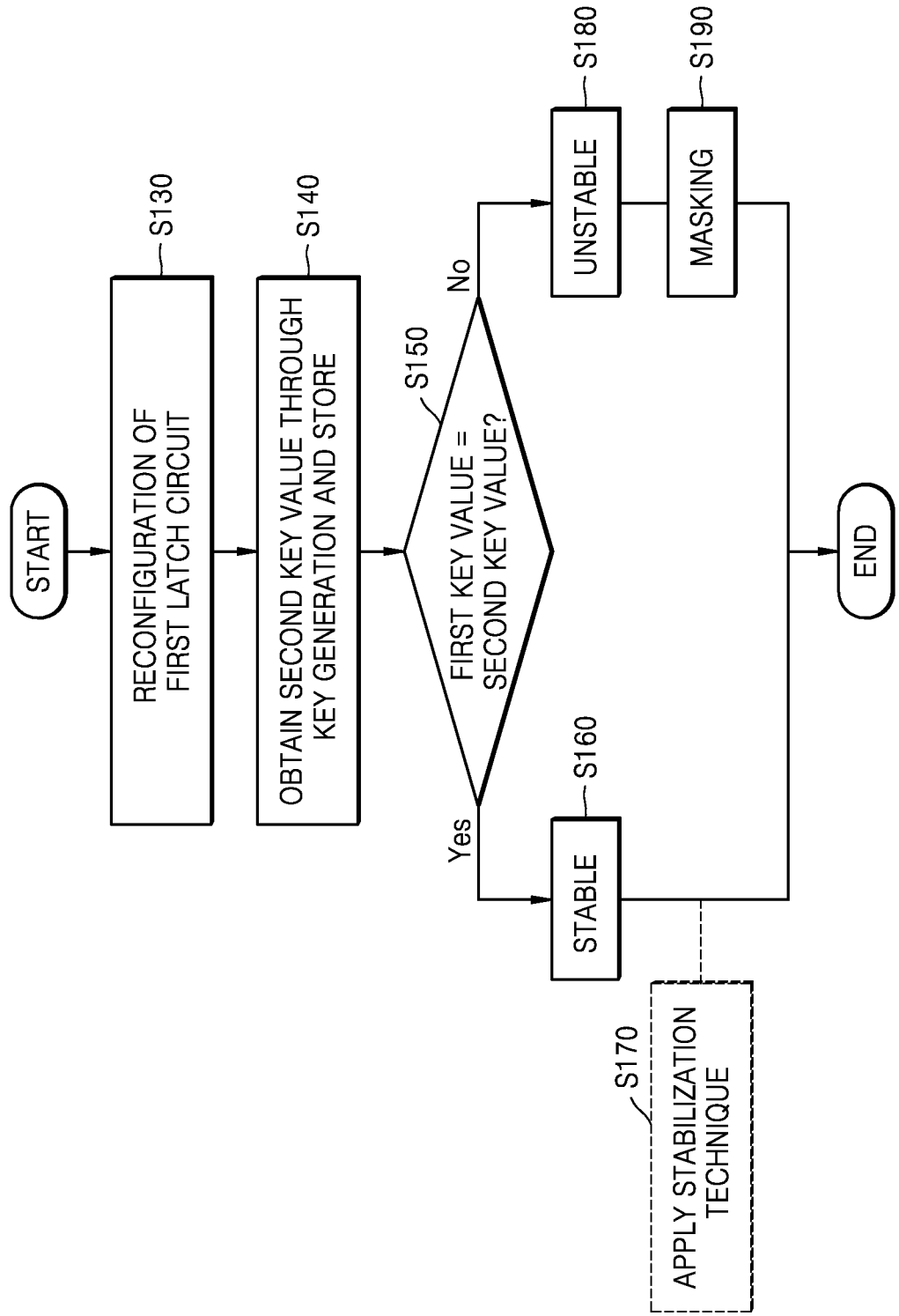
FIG. 17 is a flowchart illustrating a method of determining a scan flip-flop according to an embodiment.

FIG. 17 is a flowchart illustrating a method of determining a scan flip-flop according to an embodiment.

Referring to FIGS. 9, 16, and 17, a method of controlling a scan flip-flop may determine whether the scan flip-flop is stable or not. The scan flip-flop 100 may reconfigure the first latch circuit 200 through a switching operation (S130) and obtain a second key value through the operation of generating and storing the key described with reference to FIG. 16 based on the reconfigured circuit (S140). To determine the scan flip-flop, the generated first key value and second key value may be compared (S150). In some embodiments, as described with reference to FIG. 9, when the first key value and the second key value are same, a difference between the first threshold voltage $V_1$ and the reference threshold voltage $V_r$ is relatively large. Thus, the corresponding scan flip-flop may be determined to be relatively stable (S160). In some embodiments, the scan flip-flops (or cells including the scan flip-flops) that are determined to be stable are additionally subject to a stabilization technique (e.g., temporal majority voting (TMV)) that removes external influences such as noise, and thus, the stability of the scan flip-flops may be improved (S170). In some cases, TMV filters out random noise by taking multiple bits in time or space domain for a single bit output.

In some cases, if the first key value and the second key value are not same, the corresponding scan flip-flops are determined to be relatively unstable (S180) because the difference between the first threshold voltage $V_1$ and the reference threshold voltage $V_r$ is relatively small. In some embodiments, scan flip-flops (or cells including the scan flip-flops) determined to be unstable may make PUF data unstable and thus may be masked (S190).

Figure 18:
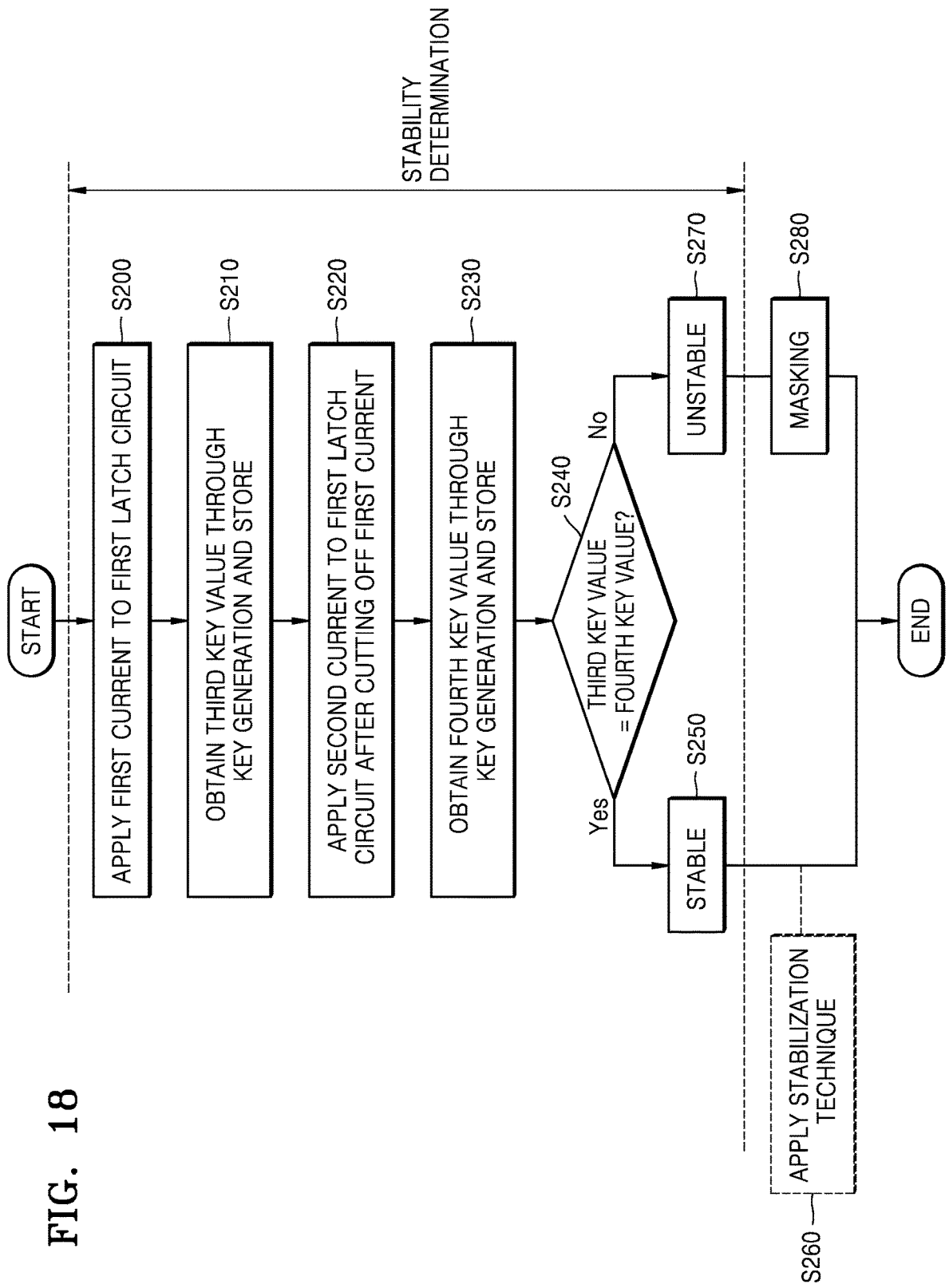
FIG. 18 is a flowchart illustrating a method of determining the stability of a scan flip-flop according to an embodiment.

FIG. 18 is a flowchart illustrating a method of determining stability of a scan flip-flop according to an embodiment.

Referring to FIGS. 10 to 12, 17, and 18, a method of controlling a scan flip-flop may determine the stability of a scan flip-flop. As described with reference to FIG. 11A, the scan flip-flop 100 may provide the first applied current $I_{bias,P}$ to the first latch circuit 200 (S200). The scan flip-flop 100 may acquire a third key value by repeating the operation of generating and storing the key described with reference to FIG. 16 based on the first applied current $I_{bias,P}$ (S210). Next, the scan flip-flop 100 may cut off the first applied current $I_{bias,P}$ and then provide the second applied current $I_{bias,N}$ to the first latch circuit 200, and obtain a fourth key value by similarly repeating the operation of generating and storing a key (S220, S230). In order to determine the stability of the scan flip-flop, the acquired third and fourth key values may be compared (S240). In some embodiments, if the third key value and the fourth key value are same, e.g., the key values are same because the difference between the first threshold voltage $V_1$ and the reference threshold voltage $V_r$ is relatively large despite the application of a current. Thus, the corresponding scan flip-flop may be determined to be relatively stable (S250). In some embodiments, the scan flip-flops (or cells including the scan flip-flops) that are determined to be stable are additionally subject to a stabilization technique (e.g., TMV) that removes external influences. Thus, the stability of the scan flip-flops may be improved (S260).

In some cases, the third key value and the fourth key value are not the same because the difference between the first threshold voltage $V_1$ and the reference threshold voltage $V_r$ is relatively small. For example, the key values are not the same due to the application of a current and thus the scan flip-flop to be performed may be determined to be relatively unstable (S270). In some embodiments, the scan flip-flops (or cells including the scan flip-flops) determined to be unstable may be masked (S280).

Figure 19:
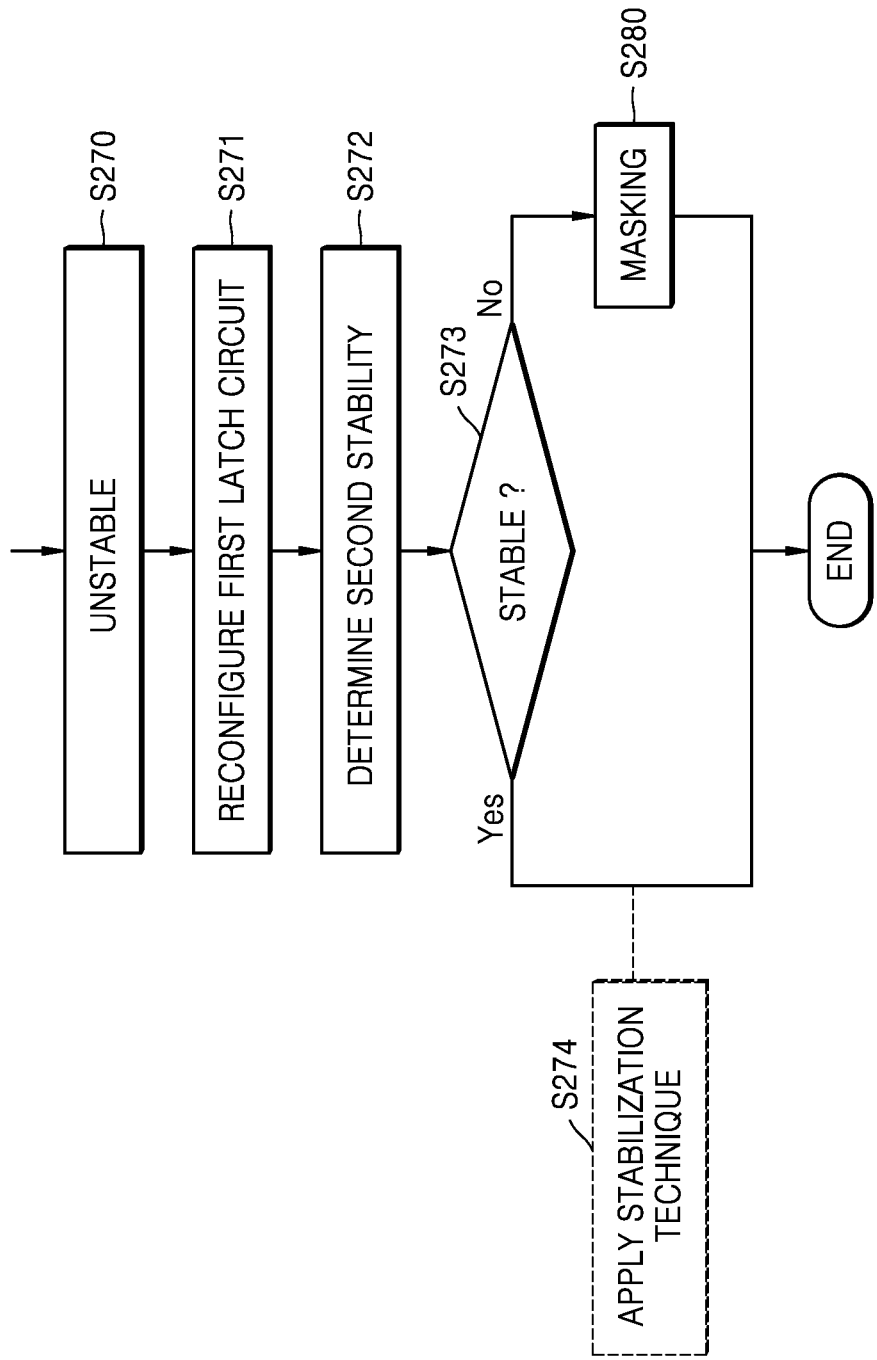
FIG. 19 is a flowchart illustrating a method of determining stability according to reconfiguration of a scan flip-flop according to an embodiment.

FIG. 19 is a flowchart illustrating a method of determining stability of a scan flip-flop according to reconfiguration of the scan flip-flop according to an embodiment.

Referring to FIGS. 13 to 15, 18, and 19, the method of controlling scan flip-flops may utilize scan flip-flops determined to be unstable in the first stability determination. As described with reference to FIG. 13, the scan flip-flops (or cells including the scan flip-flops) determined to be unstable may reconfigure the first latch circuit 200 (S271). In some embodiments, based on the reconfiguration of the first latch circuit 200, a difference in switching threshold voltage compared to before the reconfiguration of the circuit may be relatively increased. That is, the stability of the scan flip-flop may be increased due to circuit reconfiguration.

In some embodiments, as described with reference to FIGS. 13 to 15, in the method of controlling the scan flip-flops, the stability determination operations S200 to S250, and S270 described above with reference to FIG. 18 may be repeated for the scan flip-flops in which circuits are reconfigured in operation S271 (S272). In the same way, in the method of controlling the scan flip-flops according to an embodiment, the stability of scan flip-flops (or cells including the scan flip-flops) in which circuits are reconfigured may be determined by comparing the key values generated in operation S272 (S273). In some embodiments, when the scan flip-flops (or cells including the scan flip-flops) are determined to be stable due to the circuit reconfiguration, an additional stabilization technique may be applied (S274), or if the scan flip-flops (or cells including them) are determined to be unstable despite the circuit reconfiguration, the scan flip-flops may be masked (S280).

Figure 20:
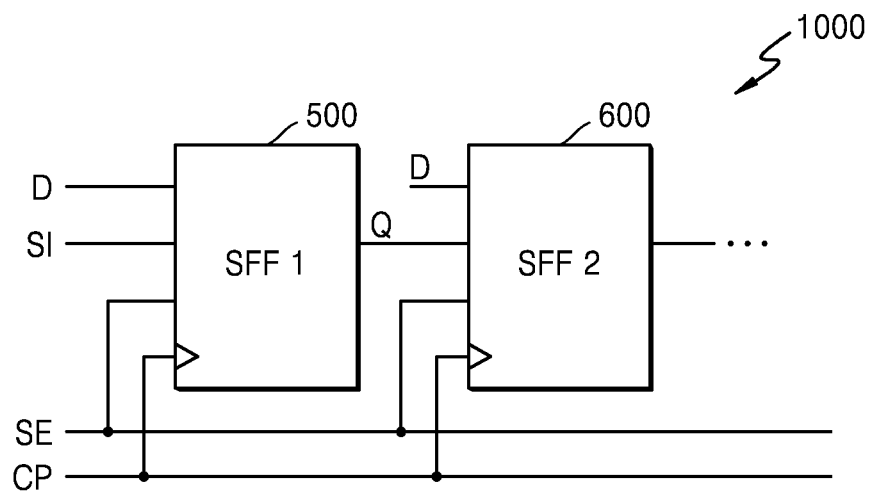
FIG. 20 is a block diagram schematically illustrating a scan chain circuit according to an embodiment.

FIG. 20 is a block diagram schematically illustrating a scan chain circuit 1000 according to an embodiment.

Referring to FIG. 20, the scan chain circuit 1000 may include a plurality of scan flip-flops including a first scan flip-flop 500 and a second scan flip-flop 600. Each of the first and second scan flip-flops 500 and 600 may be implemented or may function as one of the scan flip-flops illustrated in FIGS. 1 to 14. For example, each of the first and second scan flip-flops 500 and 600 may generate a key using a latch circuit included therein. In addition, each of the first and second scan flip-flops 500 and 600 may be manufactured based on a standard cell having a PUF function based on a standard cell library and a PUF cell library. For example, each of the first and second scan flip-flops 500 and 600 may be designed based on the process described with reference to FIG. 8.

Each of the first and second scan flip-flops 500 and 600 may include a third terminal configured to receive a scan enable signal SE and a clock terminal configured to receive a clock waveform CP. Specifically, the first scan flip-flop 500 may include a first terminal configured to receive a data input signal D and a second terminal configured to receive a scan input signal SI, and may output an output signal Q. Similarly, the second scan flip-flop 600 may include a first terminal configured to receive the data input signal D and a second terminal configured to receive the output signal Q of the first scan flip-flop 500.

However, the present disclosure is not limited thereto. In some embodiments, the first and second terminals of the first scan flip-flop 500 may receive an output signal Q and an inverted output signal, respectively. Additionally, in some embodiments, the first and second terminals of the first scan flip-flop 500 may receive an inverted output signal. Although not shown, in some embodiments, the output signal Q of the first scan flip-flop 500 may be processed by a logic circuit and then may be input to at least one of the first terminal and the second terminal of the second scan flip-flop 600. Here, the logic network may be a combinational logic circuit. In addition, the scan chain circuit 1000 may be included in a sequential circuit unit and function as a scan test circuit together with a combination circuit unit.

Figure 21:
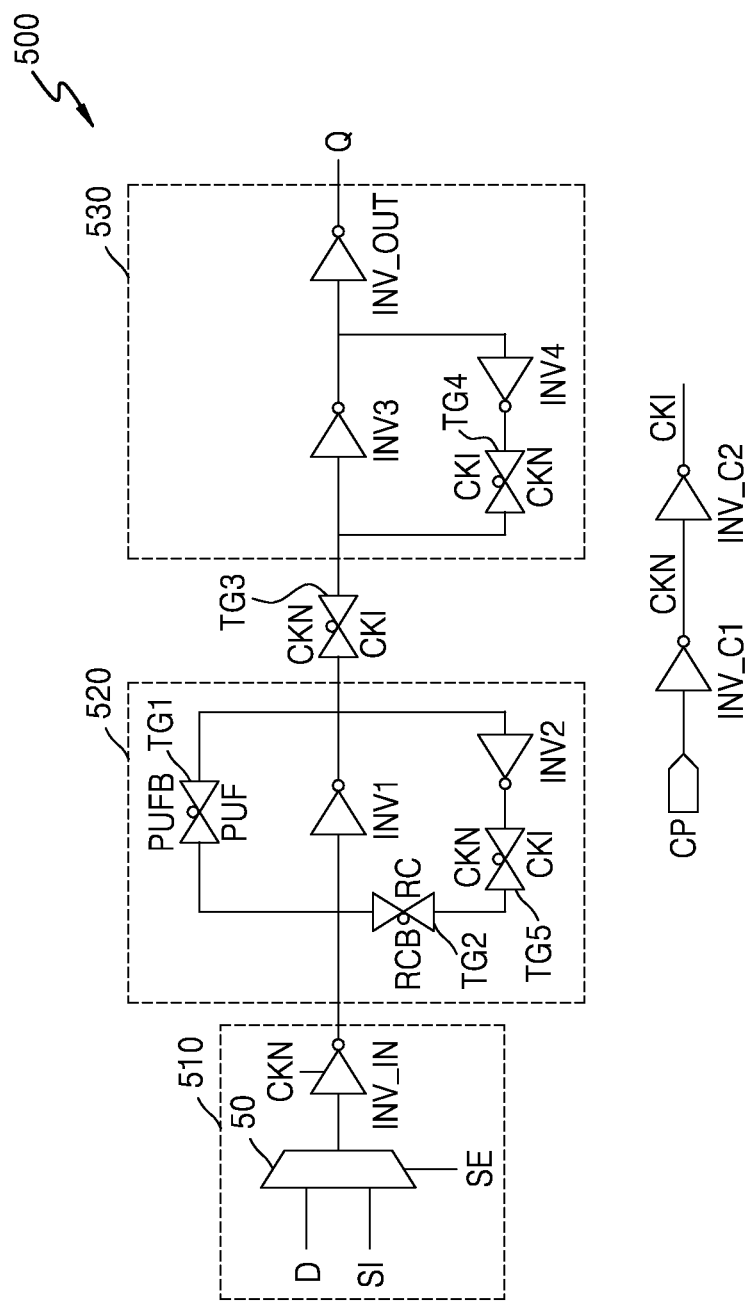
FIG. 21 is a circuit diagram illustrating a scan flip-flop according to an embodiment.

FIG. 21 is a circuit diagram specifically illustrating a first scan flip-flop 500 according to an embodiment.

Referring to FIGS. 1 to 4, 20, and 21, the first scan flip-flop 500 may include an input unit 510, a third latch circuit 520, and a fourth latch circuit 530. Here, the third latch circuit 520 and the fourth latch circuit 530 may be connected through a third transmission gate TG3. The input unit 510 may include a multiplexer 50 and an input inverter INV_IN.

The third latch circuit 520 may include first, second, and fifth transmission gates TG1, TG2, and TG5 and first and second inverters INV1 and INV2. In some embodiments, the third latch circuit 520 may further include transistors to apply an additional bias current to perform the stability determination operation described with reference to FIGS. 10 to 16.

The fourth latch circuit 530 may include an output inverter INV_OUT, third and fourth inverters INV3 and INV4, and a fourth transmission gate TG4.

The first to fourth transmission gates TG1 to TG4 may correspond to the first to fourth switches S1 to S4 described with reference to FIG. 4, and the input inverter INV_IN may correspond to the input switch IN_S. The operation process of each component and the resultant function are same as those described with reference to FIGS. 1 to 13, and thus are omitted.

A first input signal CKN and a first inverted input signal CKI may be provided as input signals to the third to fifth transmission gates TG3 to TG5. A first clock inverter INV_C1 may receive a clock waveform CP and output a first input signal CKN, and the second clock inverter INV_C2 may receive the first input signal CKN and output a first inverted input signal CKI. The third transmission gate TG3 and the fifth transmission gate TG5 may be switched according to the first input signal CKN and the first inverted input signal CKI, and the input inverter INV_IN and the fourth transmission gate TG4 may operate complimentarily with the third and fifth transmission gates TG3 and TG5.

In some embodiments, the first transmission gate TG1 may receive a second input signal PUF and a second inverted input signal PUFB as input signals, and the second transmission gate TG2 may receive a third input signal RC and a third inverted input signal RCB as input signals. For example, by setting the second input signal PUF to a logic high level, a key value may be generated as described with reference to FIG. 6. In some cases, by setting the third input signal RC to a logic high level, a circuit may be reconfigured as described with reference to FIG. 9. That is, through control of the first to third input signals CKN, PUF, and RC and the first to third inverted input signals CKN, PUFB, and RCB, various operations of the scan flip-flop described with reference to FIGS. 3 to 14 may be implemented.

For example, when the clock waveform CP is a logic high level, the third and fifth transmission gates TG3 and TG5 may be turned on, and the input inverter INV_INV and the fourth transmission gate TG4 may be turned off. In some cases, when the second input signal PUF is a logic high level, the first transmission gate TG1 may be turned on, and when the third input signal RC is a logic low level, the second transmission gate TG2 may be turned off. In this case, the third inverter INV3 may generate a key value by amplifying a difference between the switching threshold voltage of the first inverter INV1 and the switching threshold voltage of the third inverter INV3.

While the present disclosure has been particularly shown and described with reference to embodiments thereof, it will be understood that various changes in form and details may be made therein without departing from the spirit and scope of the following claims.

The processes discussed above are intended to be illustrative and not limiting. One skilled in the art would appreciate that the steps of the processes discussed herein may be omitted, modified, combined, and/or rearranged, and any additional steps may be performed without departing from the scope of the invention. More generally, the above disclosure is meant to be exemplary and not limiting. Only the claims that follow are meant to set bounds as to what the present invention includes. Furthermore, it should be noted that the features and limitations described in any one embodiment may be applied to any other embodiment herein, and flowcharts or examples relating to one embodiment may be combined with any other embodiment in a suitable manner, done in different orders, or done in parallel. In addition, the systems and methods described herein may be performed in real time. It should also be noted, the systems and/or methods described above may be applied to, or used in accordance with, other systems and/or methods.

What is claimed is:

1. A scan flip-flop comprising:
   a multiplexer configured to provide an internal signal through an input switch;
   a first latch circuit configured to latch the internal signal, wherein the first latch circuit comprises a first inverter, a second inverter, a first switch connected in parallel with the first inverter, and a second switch connected in series with the second inverter, wherein one terminal of the first switch, one terminal of the second switch, and an input terminal of the first inverter are connected to each other, and another terminal of the first switch, an output terminal of the first inverter, and an input terminal of the second inverter are connected to each other;
   a second latch circuit configured to latch an output of the first latch circuit and output a latched value, wherein the second latch circuit comprises a third inverter, a fourth inverter, an output inverter connected in series with the third inverter, and a fourth switch connected in series with the fourth inverter, wherein one terminal of the fourth switch and an input terminal of the third inverter are connected to each other, and an output terminal of the third inverter, an input terminal of the fourth inverter, and an input terminal of the output inverter are connected to each other; and
   a third switch configured to switch between the first latch circuit and the second latch circuit.

2. The scan flip-flop of claim 1, wherein:
   the input switch, the second switch, and the fourth switch are in a turned-off state and the first switch and the third switch are in a turned-on state,
   the first inverter is configured to generate a first switching threshold voltage, and
   the third inverter is configured to generate a first key value by amplifying a difference between the first switching threshold voltage and a reference switching threshold voltage of the third inverter.

3. The scan flip-flop of claim 2, wherein:
   the third switch is in a turned-off state and the fourth switch is in a turned-on state, and
   the first key value is latched in the second latch circuit.

4. The scan flip-flop of claim 2, wherein:
   the second switch is turned on from the turned-off state,
   the first inverter is configured to generate a second switching threshold voltage, and
   the third inverter is configured to generate a second key value by amplifying a difference between the second switching threshold voltage and the reference switching threshold voltage.

5. The scan flip-flop of claim 4, wherein when the first key value and the second key value are different from each other, a scan chain circuit is configured to mask the scan flip-flop.

6. The scan flip-flop of claim 1, wherein the first latch circuit further includes a first transistor and a second transistor each connected to an output terminal of the first inverter and configured to apply a current,
   wherein the first transistor is a P-channel metal oxide semiconductor (PMOS) transistor, and the second transistor is an N-channel metal oxide semiconductor (NMOS) transistor.

7. The scan flip-flop of claim 6, wherein the scan flip-flop is configured to generate comparison key values when the input switch, the second switch, and the fourth switch are turned off, and the first switch and the third switch are turned on, and
   the comparison key values are generated by the third inverter receiving a first control voltage and generating a third key value by amplifying a difference between the first control voltage and a reference switching threshold voltage of the third inverter based on a current of the first transistor, and by the third inverter receiving a second control voltage and generating a fourth key value by amplifying a difference between the second control voltage and the reference switching threshold voltage based on a current of the second transistor.

8. The scan flip-flop of claim 7, wherein a scan chain circuit is configured to mask the scan flip-flop when the third key value and the fourth key value are different from each other.

9. The scan flip-flop of claim 7, wherein, when the third key value and the fourth key value are different from each other,
   the second switch is turned on from an off state to reconfigure the first latch circuit,
   the first inverter is configured to generate a new switching threshold voltage, and
   the third inverter is configured to generate a new key value by receiving the new switching threshold voltage and amplifying a difference between the new switching threshold voltage and the reference switching threshold voltage of the third inverter.

10. The scan flip-flop of claim 9, wherein the comparison key values are generated repeatedly based on the reconfigured first latch circuit.

11. The scan flip-flop of claim 7, wherein a voltage applied to a gate of the first transistor and a gate of the second transistor is controlled by an external control.

12. A method of controlling a scan flip-flop comprising:
generating a switching threshold voltage of a first latch circuit, wherein the first latch circuit comprises a first inverter, a second inverter, a first switch connected in parallel with the first inverter, and a second switch connected in series with the second inverter, wherein one terminal of the first switch, one terminal of the second switch, and an input terminal of the first inverter are connected to each other, and another terminal of the first switch, an output terminal of the first inverter, and an input terminal of the second inverter are connected to each other;
generating a first key value by amplifying a difference between the switching threshold voltage and a reference switching threshold voltage of a second latch circuit, wherein the second latch circuit comprises a third inverter, a fourth inverter, an output inverter connected in series with the third inverter, and a fourth switch connected in series with the fourth inverter, wherein one terminal of the fourth switch and an input terminal of the third inverter are connected to each other, and an output terminal of the third inverter, an input terminal of the fourth inverter, and an input terminal of the output inverter are connected to each other, and
storing the first key value in the second latch circuit.

13. The method of claim 12, further comprising:
reconfiguring the first latch circuit through a switching operation;
obtaining a second key value based on the reconfigured first latch circuit; and
comparing the first key value and the second key value.

14. The method of claim 13, wherein the comparing of the first key value and the second key value comprises masking a scan flip-flop when the first key value is different from the second key value.

15. The method of claim 12, further comprising determining a stability of a scan flip-flop by:
applying a first current to the first latch circuit;
obtaining a third key value based on the first current;
blocking the application of the first current;
applying a second current to the first latch circuit;
obtaining a fourth key value based on the second current; and
comparing the third key value and the fourth key value.

16. The method of claim 15, wherein the comparing of the third key value and the fourth key value comprises masking the scan flip-flop when the third key value is different from the fourth key value.

17. The method of claim 15, wherein the comparing of the third key value and the fourth key value comprises:
reconfiguring the first latch circuit through a switching operation when the third key value and the fourth key value are different; and
obtaining a new key value based on the reconfigured first latch circuit.

18. The method of claim 17, further comprising determining the stability based on the reconfigured first latch circuit.

* * * * *